United States Patent
Tabara

[19]

[11] Patent Number: 5,910,021

[45] Date of Patent: Jun. 8, 1999

[54] MANUFACTURE OF SEMICONDUCTOR DEVICE WITH FINE PATTENS

[75] Inventor: Suguru Tabara, Hamamatsu, Japan

[73] Assignee: Yamaha Corporation, Japan

[21] Appl. No.: 08/898,417

[22] Filed: Jul. 3, 1997

Related U.S. Application Data

[63] Continuation of application No. 08/498,537, Jul. 5, 1995, abandoned.

[30] Foreign Application Priority Data

| Jul. 4, 1994 | [JP] | Japan | 6-174823 |
| Aug. 15, 1994 | [JP] | Japan | 6-213161 |

[51] Int. Cl.⁶ .................... H01L 21/28; H01L 21/461
[52] U.S. Cl. .................... 438/636; 438/669; 438/592; 438/952
[58] Field of Search .................... 438/585, 592, 438/625, 636, 637, 669, 720, 738, 952

[56] References Cited

U.S. PATENT DOCUMENTS

| 5,160,407 | 11/1992 | Latchford et al. | 438/738 |
| 5,207,868 | 5/1993 | Shinohara | 437/190 |
| 5,286,344 | 2/1994 | Blalock et al. | 156/657 |
| 5,298,463 | 3/1994 | Sandhu et al. | 437/192 |
| 5,302,538 | 4/1994 | Ishikawa | 473/193 |
| 5,326,431 | 7/1994 | Kadomura | 156/659 |
| 5,378,653 | 1/1995 | Yanagida | 438/720 |
| 5,403,781 | 4/1995 | Motsumoto | 437/190 |
| 5,427,666 | 6/1995 | Mueller et al. | 437/190 |
| 5,487,811 | 1/1996 | Iizuka | 437/200 |
| 5,494,697 | 2/1996 | Blayo et al. | 437/225 |
| 5,514,621 | 5/1996 | Tabara | 437/186 |
| 5,578,163 | 11/1996 | Yachi | 438/720 |

FOREIGN PATENT DOCUMENTS

| 60-240127 | 11/1985 | Japan . |
| 61-185928 | 8/1986 | Japan . |
| 63-232432 | 9/1988 | Japan . |
| 1-241125 | 9/1989 | Japan . |
| 2-125425 | 5/1990 | Japan . |
| 2-134818 | 5/1990 | Japan . |
| 2-270347 | 11/1990 | Japan . |
| 5-55130 | 3/1993 | Japan . |
| 5-82482 | 4/1993 | Japan . |
| 06-084842 | 3/1994 | Japan . |
| 06-029311 | 5/1994 | Japan . |

OTHER PUBLICATIONS

P.E. Riley, et al., "Plasma Etching of Aluminum for ULSI Circuits", Solid State Technology, Feb. 1993, pp. 47–48, 51–53.

J.–S. Maa, et al., "Anisotropic Etching of Polysilicon in a Single–Wafer Aluminum Etch Reactor", J. Vac. Sci. Technol. B9 (3), May/Jun. 1991, pp. 1596–1597.

A. Nagy, "Vertical Oxide Etching Without Inducing Change in Critical Dimensions", Optical Engineering, vol. 31, No. 2, Feb. 1992, pp. 335–340.

M. Sato, et al., "Suppression of Microloading Effect by Low–Temperature $SiO_2$ Etching", Jpn. J. Appl. Phys., vol. 31, 1992, pp. 4370–4375.

S. Wolf, "Silicon Processing For The ULSI Eva, vol. 1" 1986, Lattice Press, pp. 547–550, 555, 557, 558, 581.

*Primary Examiner*—John F. Niebling
*Assistant Examiner*—Ha Tran Nguyen
*Attorney, Agent, or Firm*—Ostrolenk, Faber, Gerb & Soffen, LLP

[57] ABSTRACT

A conductive layer (Ti, TiN, TiON, TiW, or a laminate thereof) having an antireflection function is formed on a gate electrode layer. The conductive layer is patterned by using a resist mask which is then removed. By using the patterned conductive layer as a mask, the gate electrode layer is patterned. An interlevel insulating film such as silicon oxide is deposited on the patterned gate electrode. A conductive layer having an antireflection function and a resist layer are formed on the interlevel insulating film. The resist layer is pattered, and the conductive layer is patterned by using the patterned resist layer as a mask. The patterned resist layer is removed. By using the patterned conductive layer as a mask, the interlevel insulating film is selectively etched to form a contact hole. A main conductive layer such as Al and a conductive layer having an antireflection function are formed and similar patterning is repeated.

6 Claims, 22 Drawing Sheets

MANUFACTURE OF SEMICONDUCTOR DEVICE WITH FINE PATTENS

This is a Continuation of application Ser. No. 08/498,537 filed on Jul. 5, 1996.

BACKGROUND OF THE INVENTION a) Field of the Invention

The present invention relates to a semiconductor device and its manufacturing method, and more particularly to a highly integrated semiconductor device having fine patterns and its manufacturing method.

b) Description of the Related Art

As the integration density of semiconductor integrated circuit devices increases the wiring patterns (inclusive of electrode patterns) are made finer and highly integrated. In order to form intersecting wiring patterns, it is necessary to form a plurality of wiring layers with interlevel or interlayer insulating films being interposed therebetween. In order to form multi-layered wiring patterns, it is necessary to perform photolithography for forming contact holes in insulating layers and for patterning wiring layers.

The following methods (A) to (D) are known as the methods of patterning a wiring or electrode conductive material layer.

(A) As shown in FIG. 32, a conductive material layer 3 is formed on an insulating film 2 covering the surface of a semiconductor substrate 1. A resist film is coated on the conductive material layer 3, and resist patterns 4A to 4C having a desired shape are patterned therefrom by photolithography in a well-known way. By using these resist patterns as a mask, the conductive material layer 3 is selectively dry-etched.

(B) As a patterning mask, a silicon oxide film or silicon nitride having a low etching rate is used (for example, refer to Japanese Patent Laid-open Publication No.2-125425). Also used as a patterning mask for patterning a polysilicon layer is a laminate of a silicon oxide or silicon nitride film and a resist layer formed thereon (for example, refer to J. S. Maa et al.: J. Vac. Sci. Technol. B9(3), May/June, 1991, pp.1596–1597).

(C) In coating a resist mask on a high reflectivity substrate, a resist layer mixed with light-absorbing dye is used.

(D) In patterning a conductive material layer formed on a high reflectivity substrate, an antireflection film is coated on the surface of the conductive material layer. As an antireflection film, a silicon nitride film is used (for example, refer to Japanese Patent Laid-open Publications Nos.1-241125 and 5-55130) or a TiN film is used (for example, refer to Japanese Patent Laid-open Publications Nos.60-240127, 61-185928, and 63-232432).

A laminate structure of a barrier metal layer, an aluminum layer and an anti-reflection layer such as TiN or amorphous silicon is etched by using resist patterns as a sole mask (P. E. Riley et al.: Solid State Technology February, 1998, pp.47–55).

When a fine wiring pattern is formed by the method (A), there occurs a phenomenon (the microloading effects of an etching rate) that an etching rate changes with a wiring space (space width).

As shown in FIG. 32, in the case of patterns reducing space widths between adjacent pairs of the resist patterns 4A, 4B, 4C, . . . , the etching rate may become lower as the space width is narrowed as shown in FIG. 33. If the conductive material layer is etched to a predetermined depth at the narrow space width, the layer at the broad space width may be etched excessively and the underlie layer such as the insulating film 2 may be thinned.

In some cases, an etching rate is increased as the space width is narrowed. As shown in FIG. 34, in the case of patterns increasing space widths between adjacent pairs of resist patterns 4a, 4b, 4c, 4d, . . . , the etching rate may be increased as the space width is narrowed as shown in FIG. 35. Therefore, if a conductive material layer 3 is etched to a predetermined depth at the broad space width, the layer at the narrow space width may be etched excessively, and if a selective etching ratio of the underlie layer is low, the underlie layer may be etched as indicated at $X_1$ and $X_2$.

When a fine wiring pattern is formed, there occurs a phenomenon (the microloading effects of a shape of an etched layer) that a shape or size of an etched layer changes with the space width. Such a size change lowers a yield of forming wiring patterns.

Specifically, as shown in FIG. 36, if densely distributed wiring patterns 3P and 3Q are formed by dry etching by using densely distributed resist patterns 4P and 4Q, the width $W_D$ of the densely distributed wiring pattern 3P for example may become nearly equal to the width $W_O$ of the resist pattern 4P ($W_D \cong W_O$). In contrast, as shown in FIG. 37, if an isolated wiring pattern 3R is formed by the same dry etching by using an isolated resist pattern 4R, generally the width $W_I$ of the isolated wiring pattern 3R becomes broader than the width $W_D$ shown in FIG. 36 ($W_I > W_D$). For the etching of a laminated layer of $WSi_2$/polycrystalline silicon, the width exceptionally becomes $W_I < W_D$.

In forming fine wiring patterns, the amount of thinning a film of mask material such as resist increases and the etching selectivity of the mask material (etching ratio of the layer to be etched with respect to the mask) lowers. There is therefore a tendency of lowering a yield of forming wiring patterns.

A film of mask material is thinned during dry etching by collisions of ions or particles having high kinetic energy with the mask material as well as the chemical reaction between gas and the mask material. Collisions of particles having high kinetic energy with the mask material truncate the shoulders of a resist film 4S as shown in FIG. 38. The angle of each mask material shoulder takes a value giving the best sputtering efficiency. A real angle is not 45° which gives the best efficiency in purely physical etching. The phenomenon of truncating the shoulders of mask material is called "faceting", and the plane formed at each shoulder is called a "facet". FIG. 39 shows a state where two opposing facets meet each other.

FIG. 38 illustrates a process of forming a wiring layer by dry-etching a conductive material layer 3 by using the resist layer 4S as a mask. A line width (wiring pattern width) K is set to have a small value approximately equal to the thickness T of the conductive material layer 3. Even if faceting occurs as shown in FIG. 38, the top surface of the resist layer 4S is left until the right and left facets meet each other. In this case, the amount T1 of thinning a resist film is equal to that of a resist pattern having a sufficiently large area as compared with the thickness T of the conductive layer 3 to be etched. The sufficiently large area means a large dimension in any in-plane direction of a resist pattern.

This phenomenon becomes more conspicuous as the width of a wiring pattern becomes small. That is to say, an effective selectivity of the wiring pattern to resist lowers more as the wiring pattern becomes narrower.

FIG. 40 shows a dependency upon a line width K of an amount of thinning a resist film, a selection ratio with respect to the resist film, and a resist taper angle θ. As shown in FIG. 40, the resist taper angle θ is an angle between a line extended from a facet and a bottom surface of the conductive material layer 3. Data shown in FIG. 40 were obtained when aluminum alloy was etched by using $BCl_3/Cl_2$ as an etchant gas and a microwave plasma etcher to be described later with reference to FIG. 16. The data shows that as the line width K becomes narrow, the amount of thinning a resist film increases (the selection ratio of the conductive material to resist lowers) and the resist taper angle θ becomes large.

Although a resist mask used as an etching mask is preferably made thin, a substantial selection ratio wiring patterns with respect to an etching mask lowers as wiring patterns are made fine, as previously described with reference to FIGS. 38 to 40. As a result, if a resist layer is made thin, the resist mask may be etched completely during etching and wiring patterns may be broken.

In order to prevent a selection ratio from being lowered as patterns are made fine, it is necessary to develop etching techniques having a high selection ratio with respect to mask material or to use mask material providing a high selection ratio. The method (B) is effective for raising a selection ratio with respect to mask material.

However, if a silicon oxide film is used as a patterning mask, this mask is associated with a problem that it rarely has a function as an antireflection film. A silicon nitride film used as a patterning mask has an insufficient antireflection function. With either method, inorganic mask material is left on the surface of a wiring pattern or an electrode after etching. If the substrate is exposed to a high temperature at a later process, the mask material may be peeled off from the surface of the wiring pattern or electrode to produce mask material particles, because of a difference of thermal expansion coefficients between mask material and conductive wiring material. Therefore, a yield is lowered. Such a phenomenon occurs at a heat treatment such as a lamp annealing process for activating impurities ion-implanted into source/drain regions and a CVD process for forming an interlevel or interlayer insulating film at a temperature of 400 to 500° C.

Another problem associated with the formation of a wiring pattern on a high reflectivity substrate is that a pattern size precision is lowered by light reflections at the substrate surface.

Specifically, suppose a situation as shown in FIG. 41. Insulating films 5A and 5B are formed on the surface of a semiconductor substrate 1, forming a step on the substrate surface. A resist layer 7A is formed over the substrate surface on a wiring material layer 6A. Light 9 is irradiated to the resist layer 7A at the exposure process through a mask 8 having a desired pattern. Light is reflected in a direction different from the incident direction at sloped surfaces A-B and C-D of the high reflectivity wiring material layer 6A, and is incident upon the regions of the resist layer 7A not to be exposed. The regions not to be exposed are applied with light. Thereafter, the resist development process is performed. FIG. 42 is a plan view of the etched resist pattern, and FIGS. 43 and 44 are cross sectional views taken along lines X—X' and Y—Y' of FIG. 42, respectively. A resist pattern 7 with a narrow part such as shown in FIG. 42 is formed.

At the flat region, the cross section of the resist pattern 7 is rectangular and has a designed width $W_1$ as shown in FIG. 43. At the region surrounded by the insulating films 5A and 5B, the cross section of the resist pattern 7 is semicircular and has a narrower width $W_2$ than the designed width W1, as shown in FIGS. 42 and 44. Therefore, as the wiring material layer 6A is dry-etched by using the resist layer 7 as a mask, the obtained wiring layer has a narrowed part the portion of width $W_2$ or is broken at this portion.

Still another problem associated with the formation of a wiring pattern on a high reflectivity substrate is that a pattern size changes at the regions having different reflectivities.

For example, as shown in FIG. 45, an insulating film 11 is formed over a substrate 1, covering an insulating film 5 and polycide gate electrode layer 10. Thereafter, a contact hole 11a reaching the substrate surface and a contact hole 11b reaching the polycide gate electrode layer 10 are formed in the insulating film 11 by dry etching using the resist layer 12 as a mask. In this case, the size $W_A$ of the contact hole 11a becomes smaller than the size $W_B$ of the contact hole 11b. The larger size of the contact hole 11b reduces an alignment margin at the photolithography process. As shown in FIG. 46, in some cases the contact hole 11b may be off-set from the position of the polycide gate electrode layer 10. Side wall oxide of the gate electrode is etched at an oxide etching process. The gate wiring interconnects the gate electrode and source/drain region. In order to avoid such a case, it is necessary to use a large alignment margin at the design stage, and so the integration density should be lowered.

A large size of a contact hole at a high reflectivity region may result from the phenomenon that the diameter R of the contact hole in the resist layer 12 becomes large. The reason of the phenomenon that the diameter R becomes large will be explained in the following.

In photolithography techniques, photosensitive material which makes resist hard to be soluble in development liquid, is decomposed only at the region exposed to light to make the resist easy to be soluble in the development liquid. A resist pattern is formed by selectively dissolving the resist. The photosensitive material is decomposed more as the exposure energy is increased. Therefore, the diameter R of the contact hole shown in FIG. 47 becomes larger as the exposure energy is increased.

Since the polycide gate electrode layer 10 having a high reflectivity exists under the resist layer 12, light reflected by this high reflectivity material is applied to the resist layer 12. Therefore, the effective exposure energy absorbed by the resist layer 12 becomes larger than at the region having a low reflectivity. As a result, decomposition of the photosensitive is enhanced and the diameter R of a contact hole becomes large.

The method (C) uses a resist layer mixed with dye which absorbs exposure light. Therefore, reflection at the lower level layer is reduced so that the size precision to be degraded by light reflection can be suppressed to some degree.

However, as shown in FIG. 48, even if a resist layer 15 containing dye is formed to have a desired pattern, on a wiring layer 14 covering an insulating film 5, the cross section of the resist layer 15 has a tapered skirt. This is because the exposure energy in resist is attenuated toward a deeper region from the surface thereof, and the region not exposed is left unetched. The size of a resist pattern becomes large as the exposure energy becomes small. A pattern width is generally and often defined by the bottom of a resist pattern. Therefore, a pattern is designed on the assumption that a skirt is formed. The skirt portions a and b of the resist layer 15 are etched when the wiring material layer 14 is dry-etched to form wiring patterns. Therefore, the wiring layer may be thinned. The resist layer 15 containing dye lowers a resolution of photolithography. It can be said therefore that the method (C) is not suitable for fine patterns.

The method (D) suppresses light reflection by forming an antireflection film on the surface of a conductive material layer under a resist layer. Therefore, this method is effective for preventing a size precision from being degraded by light reflection, and does not have the problem associated with the method (C).

Although the method (D) uses an antireflection film, a sufficiently thick resist layer is used as an etching mask so that the microloading effects during dry etching cannot be reduced.

Photolithography techniques for patterning a conductive material layer have been explained above. Similar photolithography techniques are also used for forming a contact hole or a recess in an insulating film.

A reflectivity of the surface of an insulating film is considerably small as compared to that of the surface of a conductive material layer. An insulator such as silicon oxide is transparent relative to ultraviolet rays and allows incident light to reach the surface of the underlie layer. If a high reflectivity surface such as metal and semiconductor exists under an insulating layer, a pattern precision is also degraded by reflected light beams and the microloading effects also occur.

SUMMARY OF THE INVENTION

It is an object of the present invention to provide a novel method of forming a conductive layer capable of forming a fine conductive pattern with a good size precision.

It is another object of the present invention to provide a novel method of forming an insulating film capable of forming a fine pattern hole or recess with a good size precision.

According to one aspect of the present invention, there is provided a method of manufacturing a semiconductor device, comprising the steps of: a) providing a substrate; b) forming a conductive layer over the substrate, the conductive layer serving as a main conductive layer; c) forming a conductive antireflection layer on the main conductive layer; d) providing a resist mask for patterning the conductive antireflection layer; e) selectively removing the conductive antireflection layer by a fist etching gas to form a laminated mask of the resist mask and a conductive antireflection mask self-aligned with the resist mask; and f) selectively removing the main conductive layer through the laminated mask by a second etching gas which is different from the first etching gas.

In patterning the main conductive layer, the unetched portion of the conductive antireflection layer is used as an etching mask. As the conductive antireflection layer, for example, a TiN layer may be used. In the case of the TiN layer for example, the antireflection effect is obtained if it has a thickness of about 30 to 50 nm.

Therefore, a resist layer used for patterning the conductive antireflection layer can be made thin and a depth of focus at photolithography can be improved. In patterning the main conductive layer, the microloading effects can be reduced because the mask of remaining resist and unetched portion of the conductive antireflection layer is thin.

According to another aspect of the present invention, there is provided a method of manufacturing a semiconductor device, comprising the steps of: a) providing a substrate; b) providing an interlayer insulating layer over the substrate; c) providing a first antireflection layer on the interlayer insulating layer; d) patterning the first antireflection layer to form a first antireflection film through a resist mask by a first etching gas; e) forming contact holes through the interlayer insulating layer by the first antireflection film and the resist mask used as a collective mask by a second etching gas; f) forming a main conductive layer over the substrate; g) providing a second antireflection layer on the main conductive layer; h) patterning the second antireflection layer to form a second antireflection film; and i) patterning the main conductive layer and the first antireflection film through the second antireflection film used as a sole mask to form a conductive interconnection.

As an etching mask for selectively etching an insulating layer, a conductive antireflection layer is used. As the conductive antireflection layer, for example, a TiN layer may be used. Although a conductive antireflection layer provides an antireflection function at any thickness, in the case of the TiN layer, the antireflection effect becomes maximum if it has a thickness of about 30 to 50 nm.

Therefore, a resist layer used for selectively etching the conductive antireflection layer can be made thin and a depth of focus at photolithography can be improved. In selectively etching an insulating layer, the microloading effects can be reduced because the conductive layer used as the etching mask is thin.

DETAILED DESCRIPTION OF THE PREFERRED EMBODIMENTS

FIGS. 1 to 15 illustrate a method of manufacturing a MOS IC according to an embodiment of the invention. The processes (1) to (15) of this method will be described with reference to FIGS. 1 to 15 whose serial numbers corresponds to the process number.

Figure 1:
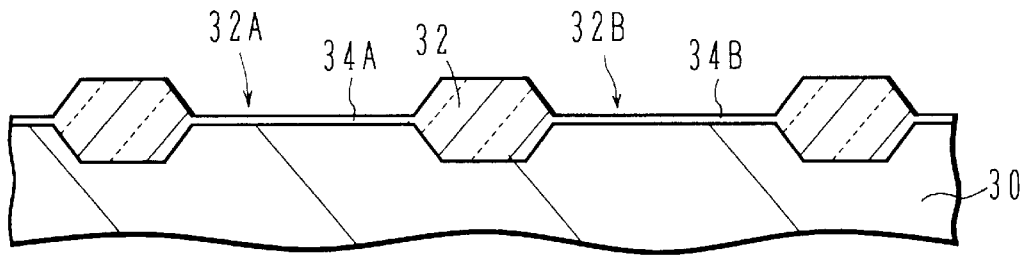
FIG. 1 is a cross sectional view of a substrate illustrating a process of forming a gate insulating film of a MOS IC manufacturing method according to an embodiment of the invention.

(1) As shown in FIG. 1, on the surface of a semiconductor substrate 30 made of, for example, silicon, a field insulating film 32 made of thermal silicon oxide is formed by welt-known selective oxidation. The insulating film 32 has holes 32A and 32B where active regions are formed. The substrate surfaces in the holes 32A and 32B are thermally oxidized to form gate insulating films 34A and 34B made of thermal silicon oxide. An $Si_3N_4$ film may be used instead of the thermal silicon oxide films 34A and 34B.

Figure 2A:
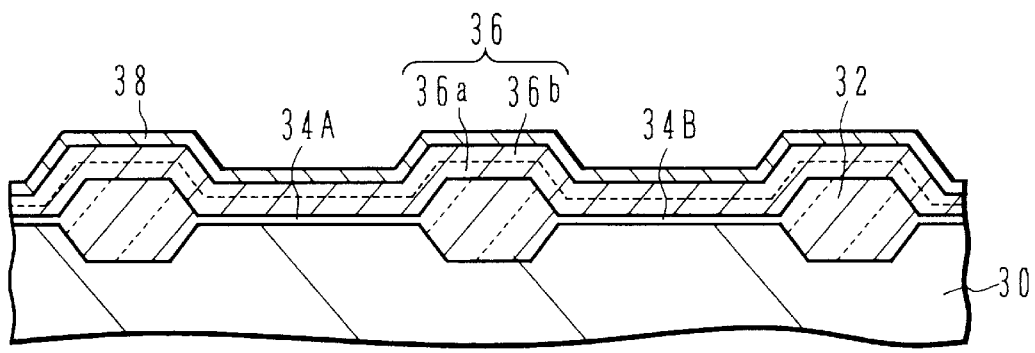
FIG. 2A is a cross sectional view of the substrate Illustrating a process of depositing electrode material and conductive material after the process of FIG. 1.
Figure 2B:
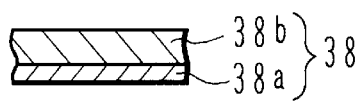
FIG. 2B is a cross sectional view showing another example of the conductive material layer.

(2) As shown in FIG. 2A, an electrode material layer 36 is deposited over the substrate surface, covering the insulating films 32, 34A, and 34B. As the electrode material layer 36, a polycrystalline Si layer or polycide layer (e.g., $WSi_2$ layer 36b on polycrystalline Si layer 36a) may be used. A conductive material layer 38 serving both as an antireflection film and etching mask is deposited on the electrode material layer 36. As the conductive material layer 38, a TiN layer or TiON layer may be used. These layers may be deposited by chemical vapor deposition (CVD) or reactive sputtering. The conductive material layer 38 may be deposited to a minimum thickness ensuring an antireflection effect. For example, the thickness of 30 to 50 nm is sufficient if a TiN layer or TiON layer is used and light of i- or g-line of mercury is used for exposure. The conductive material layer 38 may be TiN, TiON, CrN, or a laminate of these materials. For example, as shown in FIG. 2B the conductive material layer 38 is a stack or laminate of a Ti layer 38a and a TiN layer 38b.

Figure 3:
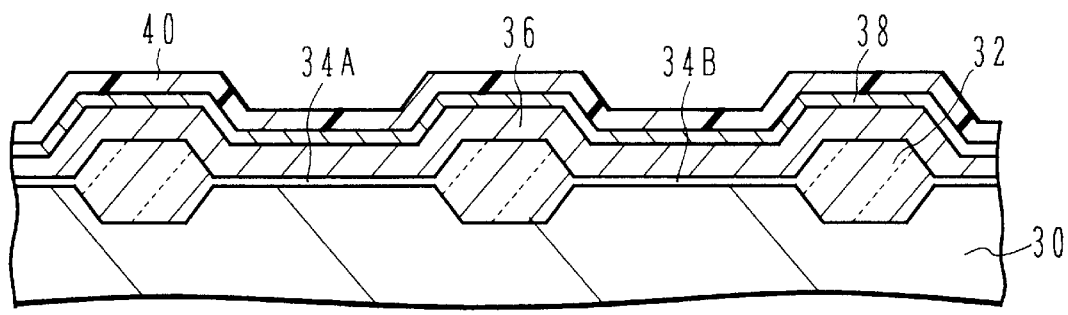
FIG. 3 is a cross sectional view of the substrate illustrating a process of coating resist after the process of FIG. 2.
Figure 4:
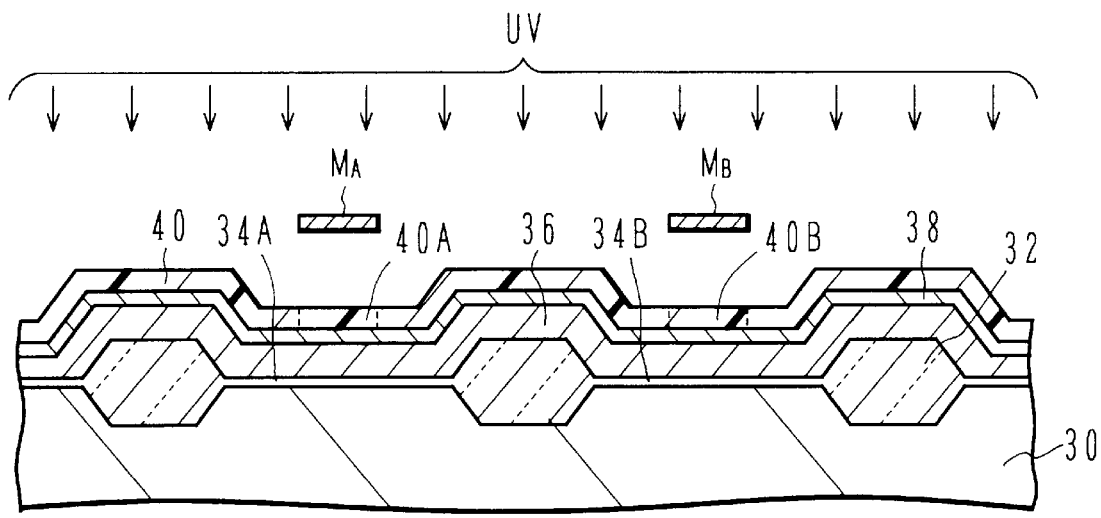
FIG. 4 is a cross sectional view of the substrate illustrating a process of exposing the resist to light after the process of FIG. 3.
Figure 5:
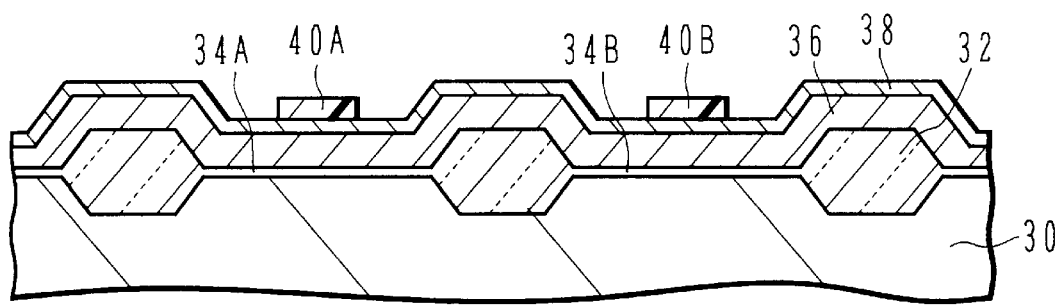
FIG. 5 is a cross sectional view of the substrate illustrating a process of developing the resist after the process of FIG. 4.

(3) In the processes illustrated in FIGS. 3 to 5, a desired resist pattern is formed by photolithography. First, as shown in FIG. 3, a resist layer 40 is formed over the substrate, by spin coating, covering the conductive material layer 38.

(4) Next, as shown in FIG. 4, an exposure process is executed. Namely, ultraviolet exposure rays are irradiated to the resist layer 40 by using light shielding masks MA and MB. Since the antireflection conductive layer 38 is formed under the resist 40, the exposure light is attenuated by the antireflection layer 38 and prevented from being intensely reflected by the underlie reflective film (polycrystalline silicon). Therefore, the size of the resist pattern 40 can be correctly controlled.

(5) Next, as shown in FIG. 5, the resist layer 40 is subjected to a development process to leave resist layers 40A and 40B having desired patterns. The resist layers 40A and 40B have a thickness sufficient for patterning at lest the conductive material layer 38 but riot so thick as to assure some thickness to remain after the following etching. For example, it may be 0.5 μm. It is therefore possible to relieve the requirements of a depth of focus of photolithography and to form a fine pattern. The microloading effects are also reduced because the resist layer thinner than a conventional resist layer is patterned.

Figure 6:
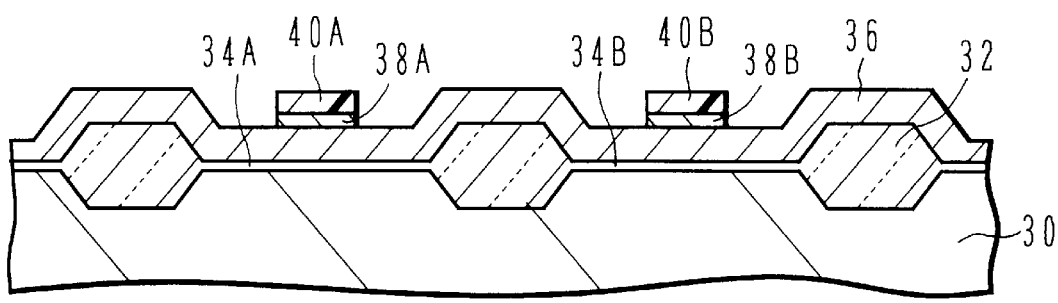
FIG. 6 is a cross sectional view of the substrate illustrating a process of etching the conductive material after the process of FIG. 5.

(6) As shown in FIG. 6, by using the resist layers 40A and 40B as a mask, the conductive material layer 38 is patterned in a selfaligned manner by dry etching to leave conductive material layers 38A and 38B (parts of the conductive layer 38). As etching gas, it is preferable to use $Cl_2$. When a TiN layer is etched, the substrate may be heated or not be heated, but the substrate temperature should be 20° C. or higher.

Figure 7:
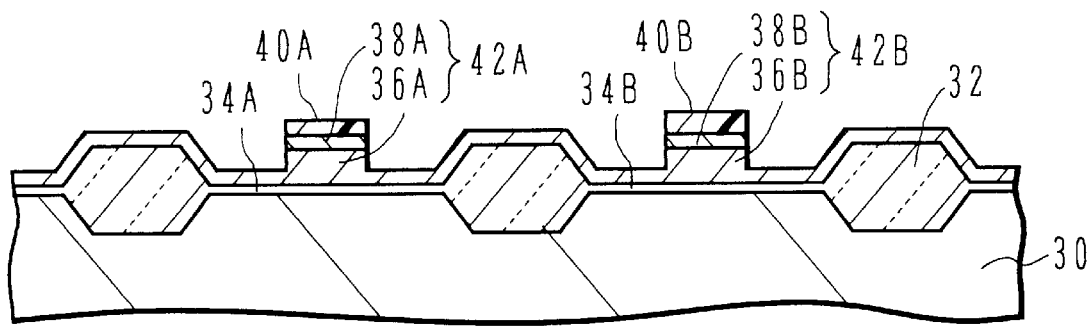
FIG. 7 is a cross sectional view of the substrate illustrating a process of etching the electrode material after the process of FIG. 6.

(7) As shown in FIG. 7, by using the stack of the resist layers 40A and 40B and the underlying conductive material layers 38A and 38B as a mask, the electrode material layer 36 is etched by dry etching. The resist layer 40A and 40B may be lost during the etching for patterning the electrode layer 36. The conductive material layers 38A and 38B will work as a mask in such a case. If the resist layers 40A and 40B remain after the etching, they are removed by ashing or by washing in organic solvent.

Figure 8:
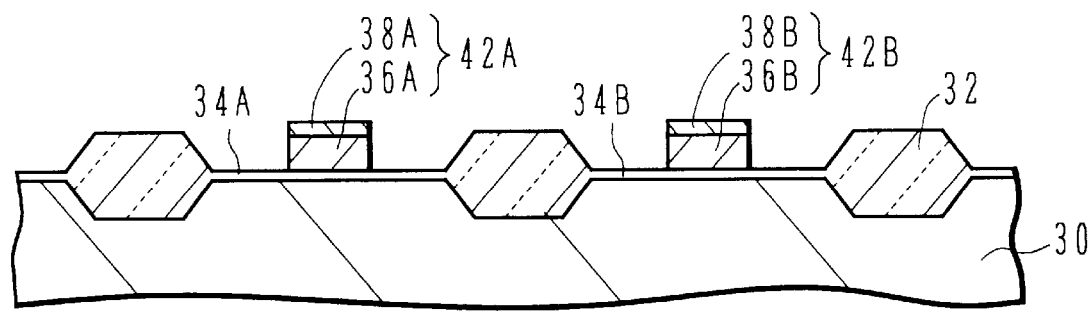
FIG. 8 is a cross sectional view of the substrate illustrating a process of removing the resist after the process of FIG. 7.

(8) As shown in FIG. 8, the electrode layer 36 is patterned after the pattern of the conductive material layer 38.

A laminate of the electrode material layer 36A and conductive material layer 38A constitutes a gate electrode layer 42A, and a laminate of the electrode material layer 36B and conductive material layer 38B constitutes a gate electrode layer 42B.

Since the antireflection film is patterned and used as an etching mask, it is not necessary to use another process of forming an etching mask.

In patterning the electrode material layer 36, gas containing $O_2$ or F, such as $Cl_2/O_2$, and $HBr/O_2$, is used as etching gas. If gas containing $O_2$ or F is used, titanium oxide (TiO, $TiO_2$, $Ti_2O_3$) or titanium fluoride ($TiF_3$) of a low vapor pressure is formed on the surface of TiN (or TiON), and TiN (or TiON) etching is suppressed. As a result, the TiN (or TiON) layer accomplishes a reliable function of an etching mask.

Figure 9:
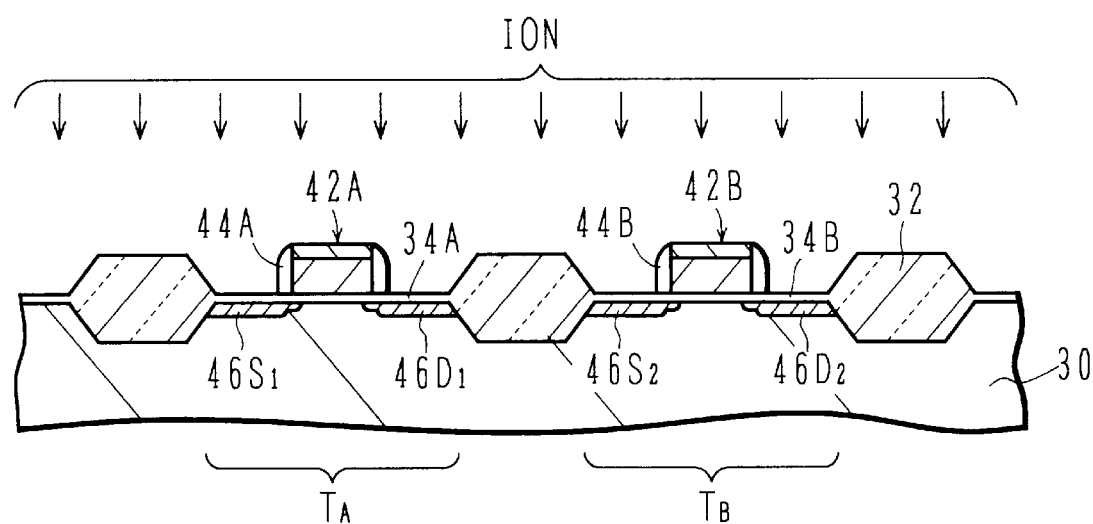
FIG. 9 is a cross sectional view of the substrate illustrating a process of forming source/drain regions after the process of FIG. 8.

(9) As shown in FIG. 9, by using the electrode layers 42A and 42B and insulating film 32 as a mask, impurity ions are selectively implanted to the substrate surface to form source/drain regions of a low impurity concentration. Side spacers 44A and 44B are formed on the side surfaces of the electrode layers 42A and 42B. For example, the side spacer is formed by depositing an $SiO_2$ film by chemical vapor deposition (CVD) conformal to the substrate surface and anisotropically etching it by reactive ion etching (RIE). Thereafter, similar to the above, impurity ions are implanted to the substrate surface to form source/drain regions of a high impurity concentration. Source regions $46S_1$ and $46S_2$ and drain regions $46D_1$ and $46D_2$ respectively having an additional low impurity concentration region are therefore formed. A MOS transistor $T_A$ includes the electrode layer 42A, source region $46S_1$, and drain region $46D_1$. A MOS transistor $T_B$ includes the electrode layer source region $46S_2$, and drain region $46D_2$.

Figure 10:
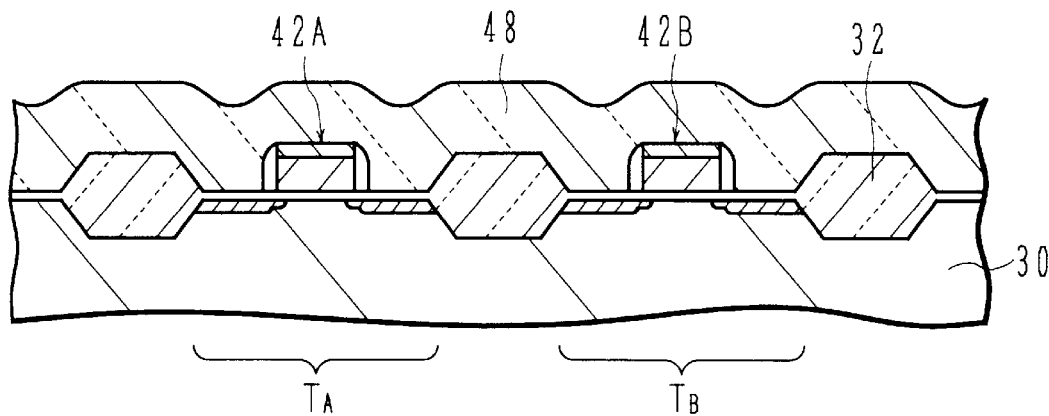
FIG. 10 is a cross sectional view of the substrate illustrating a process of forming an interlevel insulating film after the process of FIG. 9.

(10) As shown in FIG. 10, an interlevel insulating film 48 is formed over the substrate surface by chemical vapor deposition or other processes, covering the transistors $T_A$ and $T_B$ and insulating film 32. A silicon oxide film, a silicon nitride film, a phosphorus silicate glass (PSG) film, or a boron phosphorous silicate glass (BPSG) film may be used as the insulating film 48.

Figure 11:
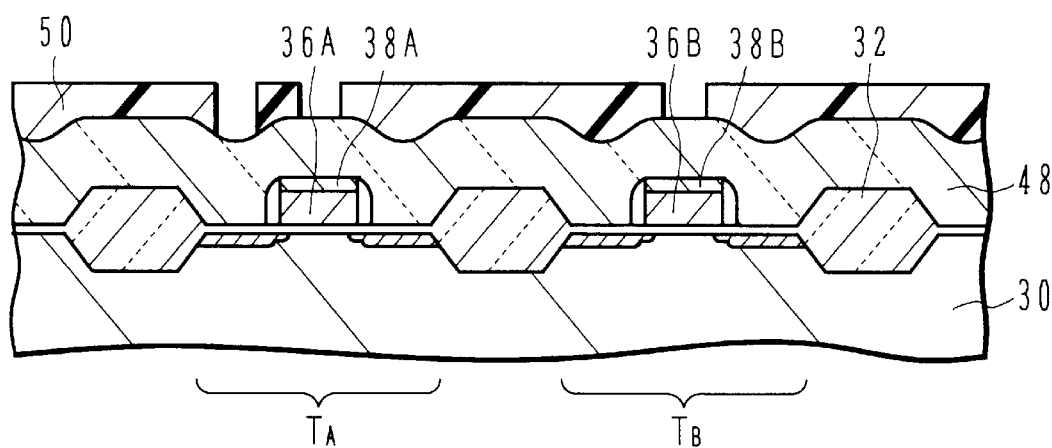
FIG. 11 is a cross sectional view of the substrate illustrating a process of forming a resist pattern after the process of FIG. 10.
Figure 12:
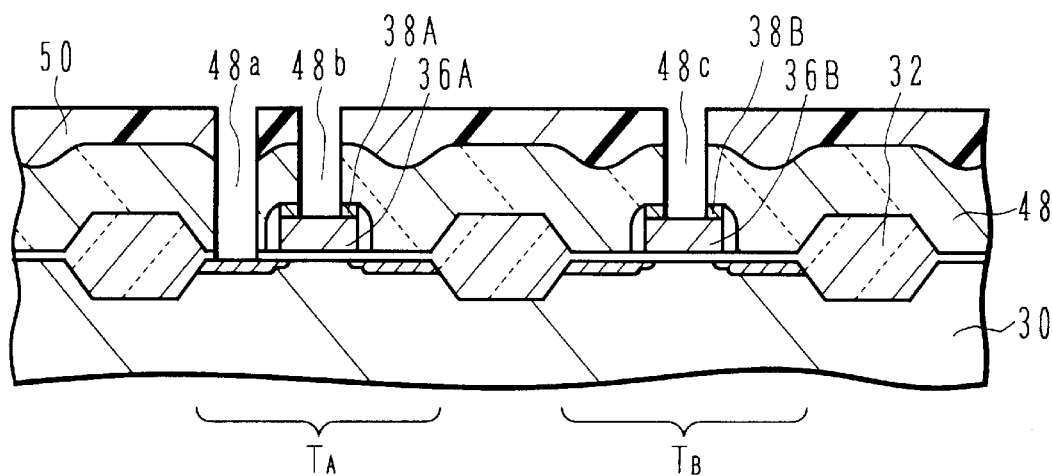
FIG. 12 is a cross sectional view of the substrate illustrating a process of forming contact holes after the process of FIG. 11.

(11) As shown in FIG. 11, a resist layer 50 having a desired contact hole pattern is formed on the insulating film 48 by photolithography. If the insulating film 48 is transparent, the conductive material layers 38A and 38B constituting the gate electrode layers function as the antireflection layers when the resist layer 50 is exposed. Reflected light reduces at the region above the gate electrode layers so that the size precision of the resist pattern becomes good. Light of g- and i-line passes through a silicon oxide film (any of BPSG, PSG, SOG, and TEOS oxide) used as the interlevel insulating film. Therefore, the precision of a pattern size can be affected by a reflectivity of the film under the interlevel insulating film.

The material of gate electrode is generally polycrystalline silicon and refractory metal silicide such as tungsten silicide. These materials have a reflectivity higher than a silicon substrate and lowers the patterning precision because exposure light is reflected by these materials. In this embodiment, the antireflection film is left on the gate electrode so that light can be prevented from being intensely reflected by the gate electrode. Even if an antireflection film is not formed on the interlevel insulating film, it is therefore possible to prevent the wiring precision from being lowered.

(12) By using the resist layer 50 as a mask, a contact hole 48a for the source 46S1 and contact holes 48b and 48c for the gates 42A and 42B are formed in the insulating film 48 by dry etching. Contact holes reaching the substrate and gates can be formed by over-etching the antireflection film on the gates without changing etching gas even after the holes reach the antireflection film on the gates. Contact holes for the source $46S_2$ and drains $46D_1$ and $46D_2$ are also formed in the insulating film 48 at the regions not shown in FIG. 12. If an insulating film such as titanium oxide or titanium fluoride is formed on the surface of the conductive material layers 38A and 38B, in order to ensure good electrical contact, the contact holes 48b and 48c are formed to pass through the conductive layers 38A and 38B and reach the electrode material layers 36A and 36B, respectively. If an insulating film is not formed on the surface of the conductive material layers 38A and 38B, the contact holes 48b and 48c are formed to reach the surfaces of the conductive material layers 38A and 38B, respectively. Thereafter, the resist layer 50 is removed.

Figure 13:
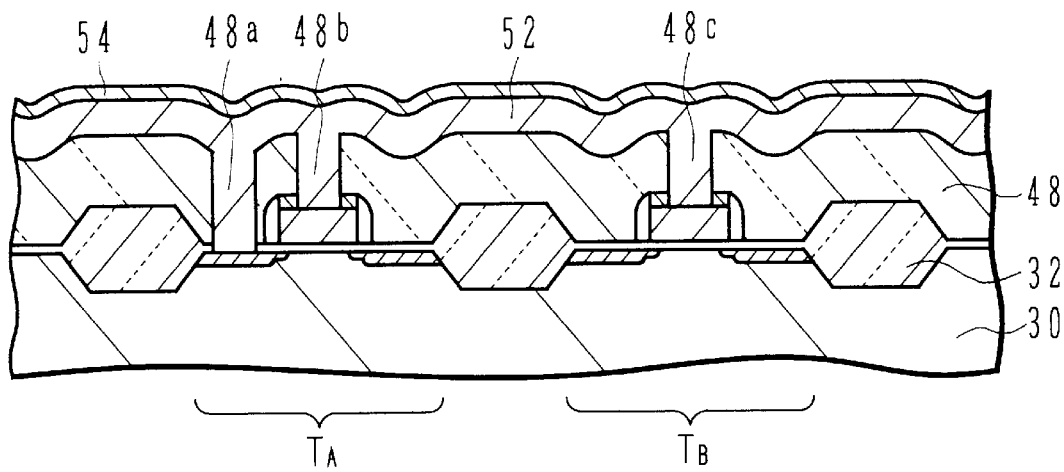
FIG. 13 is a cross sectional view of the substrate illustrating a process of depositing electrode material and conductive material after the process of FIG. 12.

(13) As shown in FIG. 13, a wiring layer 52 of lamination of a barrier metal layer (such as Ti, TiN) and an Al or Al alloy layer (made of Al-Si-Cu, Al-Si, etc.) is deposited over the substrate surface, covering the insulating film 48 and filling the contact holes 48a to 48c. A conductive layer 54 serving as both antireflection and etching mask is formed on the wiring material layer 52, in the manner described with the processes of FIGS. 2A and 2B. The material of the conductive layer 54 is a material selected from a group consisting of TiN, TiON, CrN, and a laminate thereof.

Figure 14:
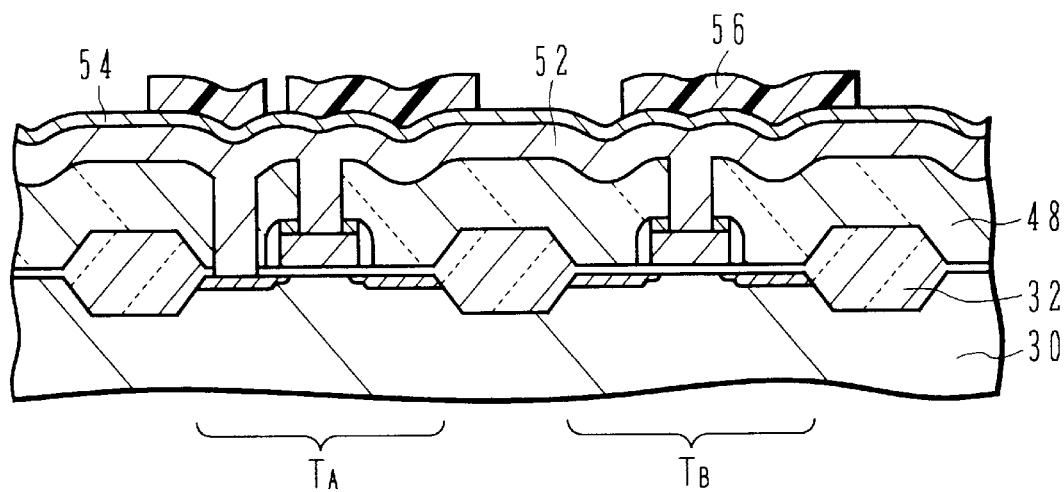
FIG. 14 is a cross sectional view of the substrate illustrating a process of forming a resist pattern after the process of FIG. 13.
Figure 15:
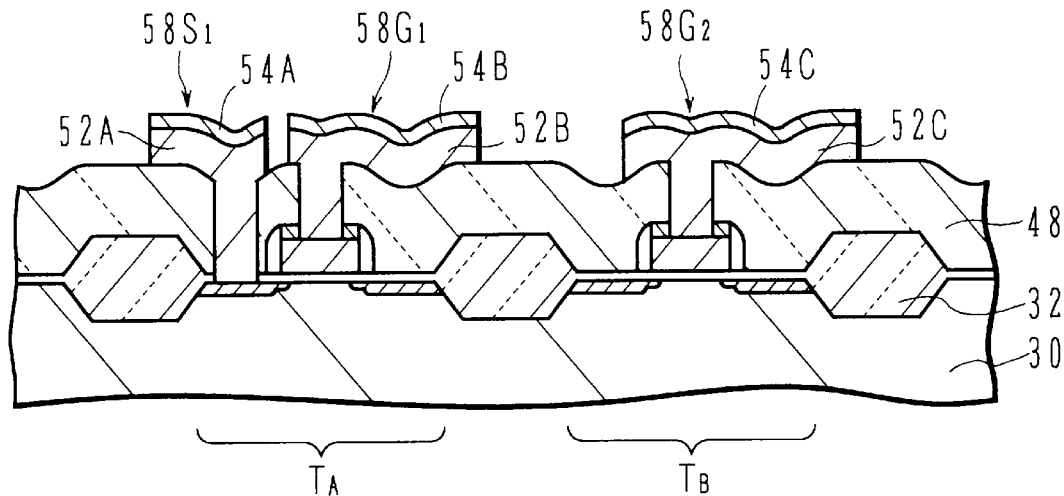
FIG. 15 is a cross sectional view of the substrate illustrating a process of forming a wiring pattern after the process of FIG. 14.

(14) As shown in FIG. 14, a resist layer 56 having a desired wiring pattern is formed on the conductive material layer 54 by photolithography.

(15) By using the resist layer 56 as a mask, the conductive material layer 54 is patterned by dry etching to leave conductive material layers 54A, 54B, and 54C (parts of the conductive material layer 54). Since the conductive material layer 54 having an antireflection function exists under the resist layer 56, reflected light reduces. By using the resist mask as a mask, the wiring layer 52 is patterned by dry etching to leave wiring material layers 52A, 52B, and 52C (parts of the wiring material layer 52). A laminate of the wiring material layer 52A and conductive material layer 54A constitutes a wiring layer 58S1 for the source of the transistor $T_A$. A laminate of the wiring material layer 52B and conductive material layer 54B constitutes a wiring layer $58G_1$ for the gate of the transistor $T_A$. A laminate of the wiring material layer 52C and conductive material layer 54C constitutes a wiring layer $58G_2$ for the gate of the transistor $T_B$.

The conductive material layers 54A, 54B, and 54C are left on the wiring material layers 52A, 52B, and 52C to be used as a film for preventing electromigration. Since Ti and TiON are conductive, the electrical characteristics of the conductive material layers 54A, 54B, and 54C are not degraded. It is not necessary therefore to use an additional process of forming a film for preventing electromigration.

In the above embodiment, the electrode material layer 36 and wiring material layer 52 are patterned without removing the resist layer, by using a laminate of the resist layer and conductive material layers 38A and 38B (or 54A, 54B, and 54C) as a mask. The resist mask is etched during dry etching for patterning the electrode material layer 36 or wiring material layer 52. It may not be necessary therefore to use a separate process of removing the resist layer.

Figure 16:
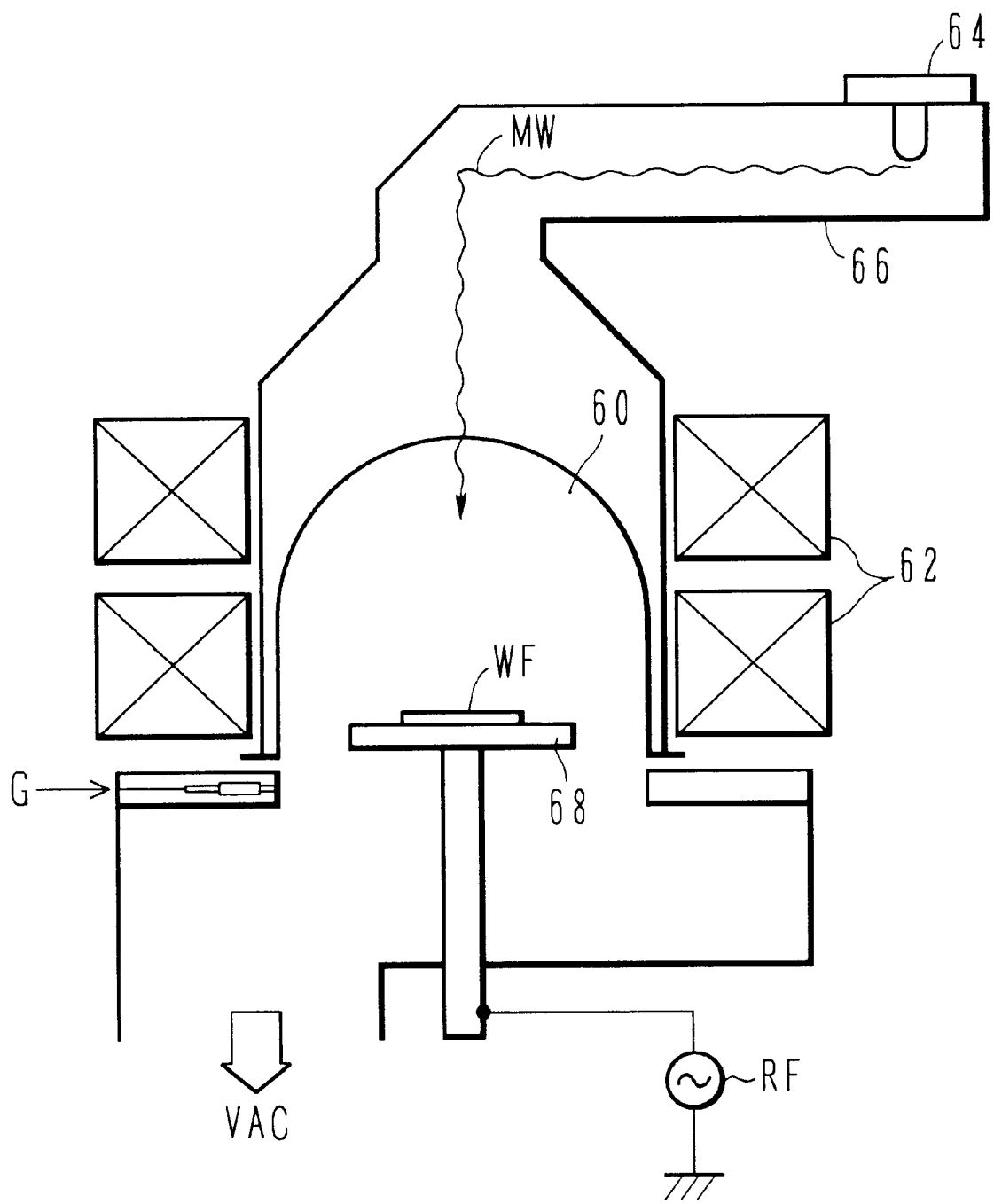
FIG. 16 is a cross sectional view showing an example of a microwave plasma etcher.
Figure 17:
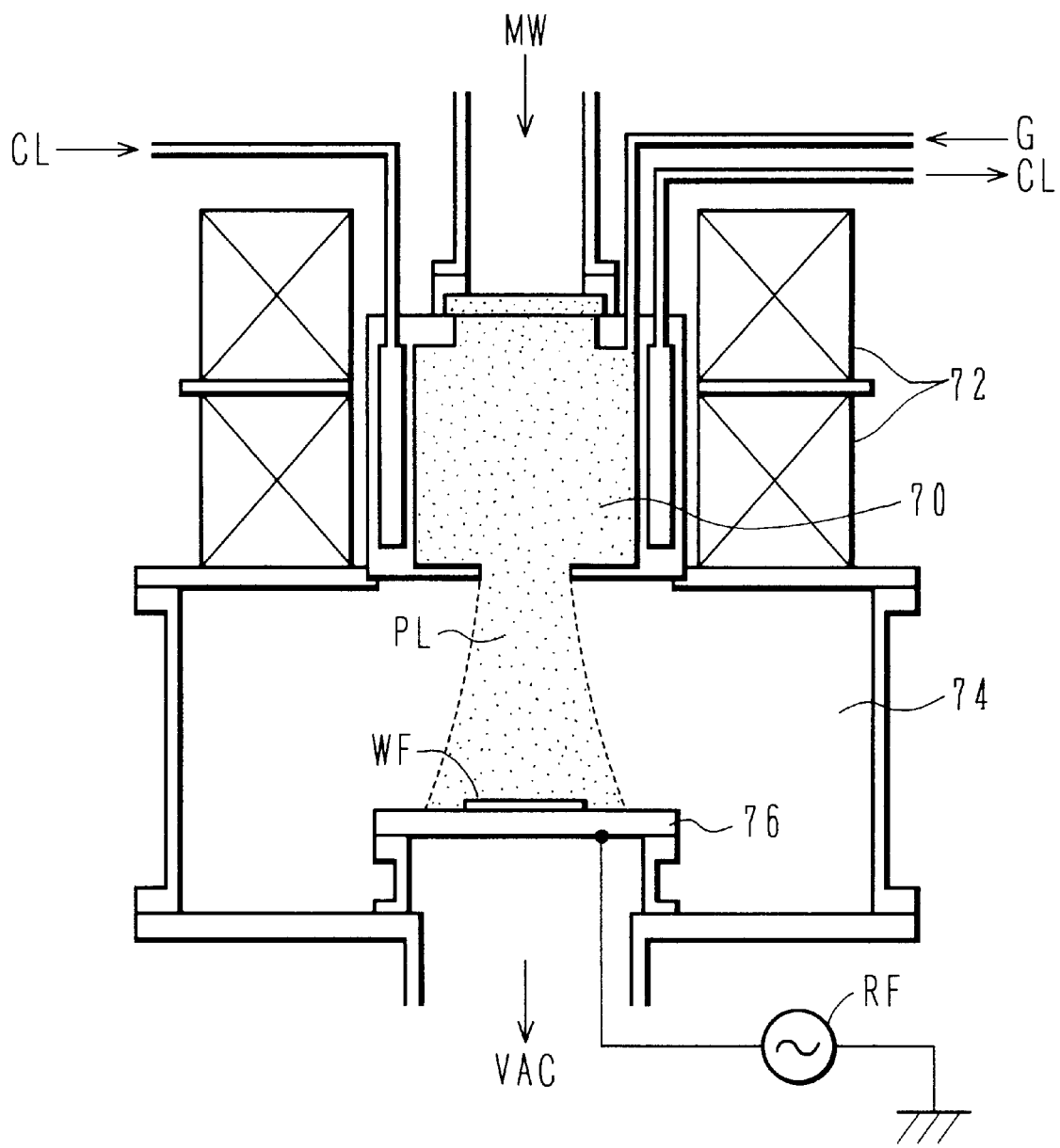
FIG. 17 is a cross sectional view showing an example of an ECR plasma etcher.
Figure 18:
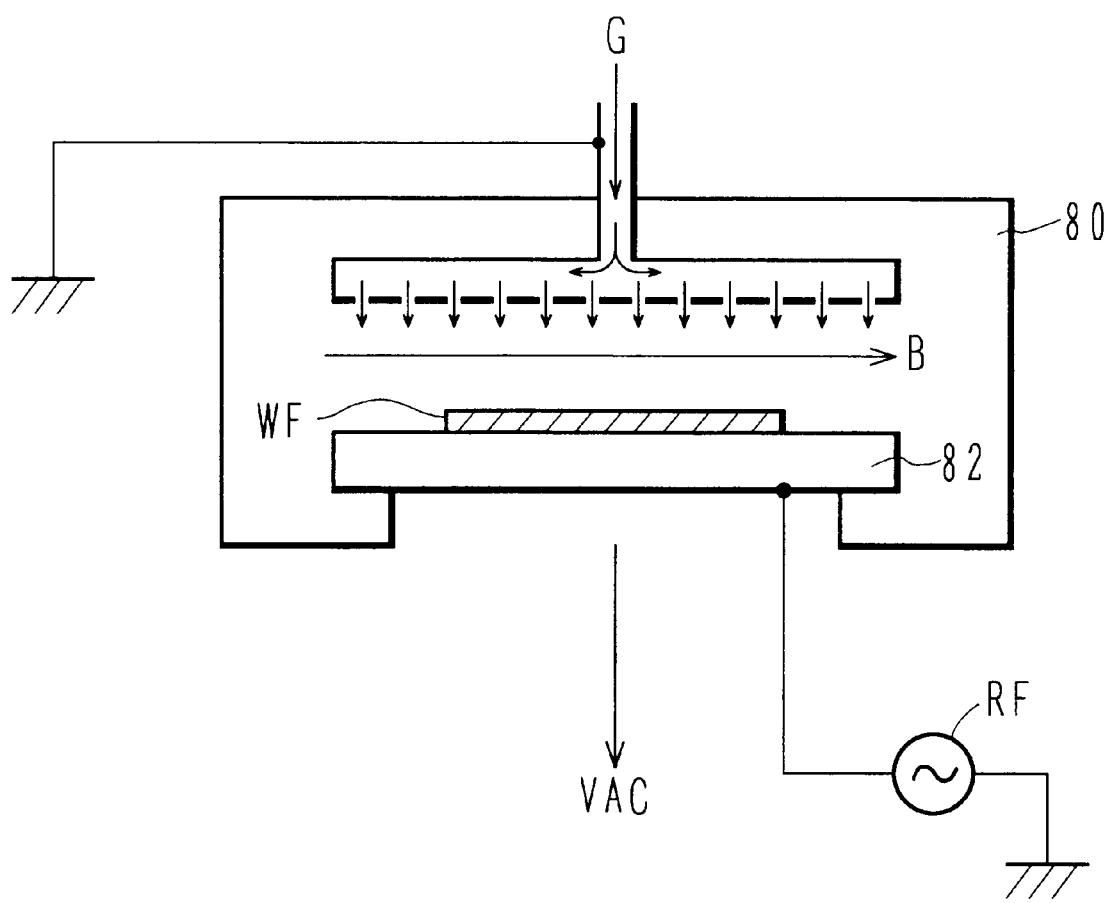
FIG. 18 is a cross sectional view showing an example of a magnetron RIE system.

In order to confirm that a TiN layer is effective as an etching mask, experiments were made in which TiN, $WSi_2$, and polycrystalline Si were etched by using gas containing $O_2$ or F and three types of dry etching systems shown in FIGS. 16 to 18.

FIG. 16 shows an example of a microwave plasma etcher. Upper and lower solenoid coils 62 are mounted at the circumference of a plasma chamber 60. A microwave MW at 2.45 GHz is supplied to the chamber 60 from a magnetron 64 via a waveguide 66. In the chamber 60, an electrode 68 for supporting a wafer (substrate) WF is mounted. The electrode 68 is connected to a radio frequency power source RF of 2 MHz. Etching gas G is supplied to the chamber 60. An evacuating system VAC is coupled to the lower side of the chamber 60.

Uniform and high density plasma can be generated in the chamber 60 under a wide range of pressure by the mutual action of microwave and magnetic field. By adjusting the RF power supplied to the electrode 68, the energy of ions applied to the wafer WF can be controlled.

FIG. 17 shows an example of an electron cyclotron resonance (ECR) plasma etcher. A magnet coil 72 is mounted at the circumference of a plasma chamber 70. A pipe for flowing cooled water (L is mounted at the circumference of the plasma chamber 70 inward of the magnet coil 72. A microwave MW at 2.45 GHz and etching gas G are supplied to the chamber 70. An etching chamber 74 is installed under the chamber 70. A plasma stream PL is supplied from the chamber 70 to the etching chamber 74. An electrode 76 for supporting a wafer WF is mounted in the chamber 74. The electrode 76 is connected to a radio frequency power source RF of 13.56 MHz. An evacuating system VAC is coupled to the lower side of the etching chamber 74.

FIG. 18 shows an example of a magnetron RIE. An electrode 82 for supporting a wafer WF is mounted in a reaction chamber 80. The electrode 82 is connected to a radio frequency power source RF of 13.56 MHz. A magnetic field in parallel to the surface of the wafer WF is generated in the reaction chamber 80 by a coil or permanent magnet (not shown). Etching gas G is supplied to the reaction chamber 80 from the upper side thereof. An evacuating system VAC is coupled to the lower side of the reaction chamber 80.

(A) Use of microwave plasma etcher

TiN and $WSi_2$ were etched by using the microwave plasma etcher shown in FIG. 16, data shown in Table 1 was obtained.

TABLE 1

|  | Condition 1 | Condition 2 | Condition 3 |
|---|---|---|---|
| $Cl_2/O_2$ | 50/0 | 29/1 | 48/2 |
| $O_2$ flow rate [%] | 0 | 3.3 | 4 |
| Etching rate [nm/min.] |  |  |  |
| TiN | 179 | 114 | 149 |
| $WSi_2$ | 195 | 211 | 328 |
| Etching rate [$WSi_2$/TiN] | 1.09 | 1.85 | 2.20 |

The following conditions were commonly fixed. A gas pressure was 5 mTorr, an RF (2 MHz) power was 30 W, a microwave power (anode current of the magnetron) was 160 mA, an electrode cooling water temperature was 20° C., an upper coil current was 20.5 A, and a lower coil current was 7.5 A.

As seen from Table 1, if $O_2$ is added to $Cl_2$, an etching rate of TiN lowers and an etching rate of $WSi_2$ increases. As a result, a selective etching ratio of $WSi_2$ to TiN is improved.

(B) Use of ECR plasma etcher

TiN having a thickness of 40 nm was etched for five minutes by using the ECR plasma etcher shown in FIG. 17. TiN was scarcely etched. The etching conditions were as follows. a flow of $Cl_2/O_2$ was 25/11 sccm, a gas pressure was 2 mTorr, an RF power (13.56 MHz) was 34 W, a microwave (2.45 GHz) power was 1400 W, and an electrode cooling water temperature was 15° C.

If it is assumed that TiN having a thickness of 40 nm was etched in five minutes, the etching rate of TiN is 8 nm/min. The etching rate of TiN is therefore slower than 8 nm/min.

$WSi_2$ and polycrystalline Si were etched under the same conditions as TiN, and data shown in Table 2 was obtained.

TABLE 2

| Etching rate [nm/min.] | | Etching ratio | |
|---|---|---|---|
| TiN | <8 | $WSi_2$/TiN | >35.1 |
| $WSi_2$ | 281 | Poly-Si/TiN | >30.3 |
| Poly-Si | 242–250 | | |

For example, in the dry etching of a polycide layer of $WSi_2$/polycrystalline Si=200/150 nm by using a TiN layer as a mask, if the TiN layer has a thickness of 13.9 nm or more, it can operate as an etching mask even if a 30% over-etch is performed, because the selective etching ratios of $WSi_2$ and polycrystalline Si to TiN are larger than 35.1 and 30.3, respectively.

If a TiN layer on a $WSi_2$ is used as an antireflection film and i- or g-line exposure light is used, the pattern precision is good if the TiN layer has a thickness of 30 to 50 nm. A TiN layer deposited on a $WSi_2$ layer serves as an antireflection layer and accomplishes a reliable function of an etching mask.

(C) Use of magnetron RIE system

TiN, $WSi_2$, and polycrystalline Si were etched by using the magnetron RIE system shown in FIG. 18, and data shown in Table 3 was obtained. The etching conditions were as follows. A flow of HBr/SF6 was 15/45 sccm, a pressure was 20 mTorr, an RF power was 250 W, a magnetic flux density was 30 Gauss, and a cooling water temperature was 40° C.

TABLE 3

| Etching rate [nm/min.] | | Etching ratio | |
|---|---|---|---|
| TiN | 21.8 | $WSi_2$/TiN | 8.2 |
| $WSi_2$ | 179 | Poly-Si/TiN | 12.1 |
| Poly-Si | 263 | | |

It can be understood from the calculation using the selective etching ratios shown in Table 3 that in the dry etching of a polycide layer of $WSi_2$/polycrystalline Si=200/150 nm by using a TiN layer as a mask, it is sufficient if the TiN layer has a thickness of 47.8 nm, even if a 30% overetch is performed. If $WSi_2$/polycrystalline Si is 100/100 nm, it is sufficient if the TiN layer has a thickness of 26.6 nm (at a 30% over-etch).

In the dry etching of a polycide layer using gas containing $O_2$ or F, a TiN can be used as an etching mask because the selective etching ratio of polycide to TiN is large. If a TiON layer is used instead of a TiN, the function as an etching mask is further improved because the selective etching ratio of polycide to TiON is higher than TiN.

When a TiN layer is used as the conductive antireflection layer, the etching gas for etching the TiN layer may be selected from the group consisting of $Cl_2$, HCl, $BCl_3$, $SiCl_4$, $Cl_2+BCl_3$, $CCl_4$, HBr, $Br_2$, HBr and combinations thereof. The etching conditions may be as follows.

(a) When a microwave plasma etcher and $Cl_2$ gas are used:

$Cl_2$ flow rate: 50 sccm,
gas pressure: 5 mTorr,
RF power: 30 W (at 2 MHz),
anode current: 160 mA,
electrode-cooling coolant temperature: 20° C., and
etching rate: 170–200 nm/min.

(b) When an ECR plasma etcher and $Cl_2$ gas are used:

$Cl_2$ flow rate: 25 sccm,
gas pressure: 1 mTorr,
RF power: 60 W (at 13.56 MHz),
microwave power: 1400 W
electrode-cooling coolant temperature: 15° C., and
etching rate: 130–150 nm/min.

When a polycide layer is to be etched, an ECR plasma etcher and an etchant gas such as $Cl_2+O_2$, $HBr+O_2$ may be used. When $Cl_2+O_2$ gas is used, the etching conditions may be:

$Cl_2$ flow rate: 25 sccm,
$O_2$ flow rate: 9–11 sccm,
gas pressure: 2 mTorr,
RF power: 30–50 W (at 13.56 MHz),
microwave power: 1000–1800 W, and
electrode-cooling coolant temperature: 15° C.

The wiring layer of Al or Al alloy may be etched by using an etchant selected from the group consisting of $BCl_3+Cl_2$, $BCl_3+Cl_2+N_2$, $BCl_3+Cl_2+CF_4$, $BCl_3+Cl_2$, $BCl_3+Cl_2+CHClF_2$, and $SiCl_4+BCl_3+Cl_2$.

When a microwave plasma etcher and an etchant gas of $BCl_3+Cl_2$ are used, the etching conditions are, for example, as follows:

$Cl_2$ flow rate: 90 sccm,
$BCl_3$ flow rate: 60 sccm,
gas pressure: 8 mTorr,
RF power: 70 W (at 2 MHz),
anode current: 300 mA, and
electrode-cooling coolant temperature: 40° C.

In the above embodiment, a conductive layer having an antireflection function and a mask function is used when a conductive layer is patterned. Similar techniques are also applied to patterning an insulating layer.

FIGS. 19 to 31 illustrate a method of manufacturing a MOS IC according to another embodiment of the invention. The processes (19) to (31) of this method will be described with reference to FIGS. 19 to 31 whose serial numbers correspond to the process numbers.

Figure 19:
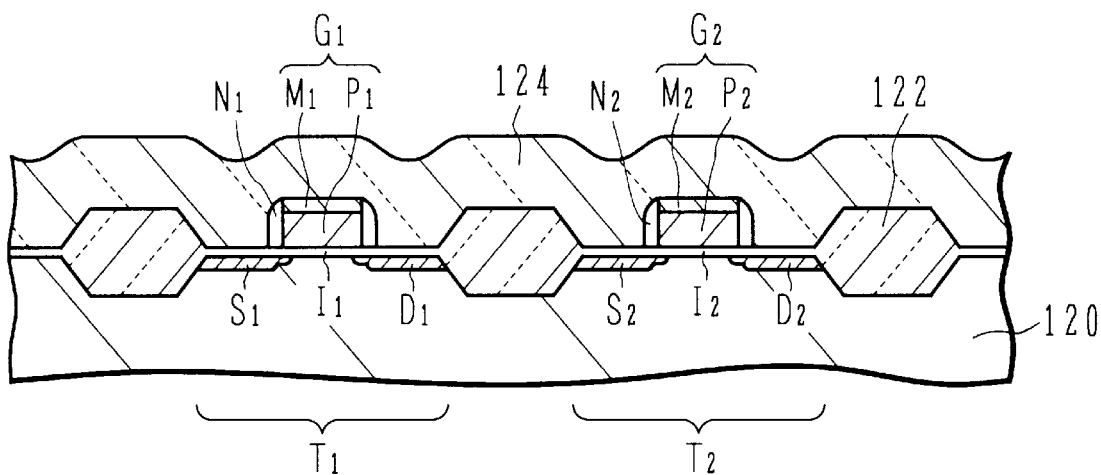
FIG. 19 is a cross sectional view of a substrate illustrating a process of forming an interlevel insulating film of the wiring pattern forming method according to another embodiment of the invention.

(19) As shown in FIG. 19, on the surface of a semiconductor substrate 120 made of, for example, silicon, a field insulating film 122 made of thermal silicon oxide is formed by well-known selective oxidation. The substrate surfaces in holes corresponding to active regions are thermally oxidized to form gate insulating films $I_1$ and $I_2$ made of thermal silicon oxide. An $Si_3N_4$ film may be used instead of the insulating films $I_1$ and $I_2$.

Polycrystalline Si and silicide ($WSi_2$ or the like) are sequentially deposited over the substrate surface. The deposited layer is patterned to form a gate electrode layer $G_1$ constituted by a polycrystalline Si layer $P_1$ and a silicide layer $M_1$, and a gate electrode layer $G_2$ constituted by a polycrystalline Si layer $P_2$ and a silicide layer $M_2$. Impurity ions are selectively implanted to the substrate surface to form source/drain regions of a low impurity concentration, by using the gate electrode layers $G_1$ and $G_2$ and insulating film 122 as a mask. Side spacers $N_1$ and $N_2$ are formed on the side surfaces of the gate electrodes $G_1$ and $G_2$. Thereafter, similar to the above, impurity ions are implanted to the substrate surface to form source/drain regions of a high impurity concentration. Source regions $S_1$ and $S_2$ and drain regions $D_1$ and $D_2$ respectively having an additional low impurity concentration region are therefore formed.

A MOS transistor $T_1$ includes the gate electrode $G_1$, source region $S_1$, and drain region $D_1$. A MOS transistor $T_2$ includes the gate electrode $G_2$, source region $S_2$, and drain region $D_2$.

An interlevel insulating film 124 is formed over the substrate surface by chemical vapor deposition or other processes, covering the transistors $T_1$ and $T_2$ and insulating film 122. A silicon oxide film, a silicon nitride film, a phosphorus silicate glass (PSG) film, or a boron phosphorous silicate glass (BPSG) film may be used as the insulating film 124. These processes are performed in a similar manner to the processes described with reference to FIGS. 1 to 10.

Figure 20:
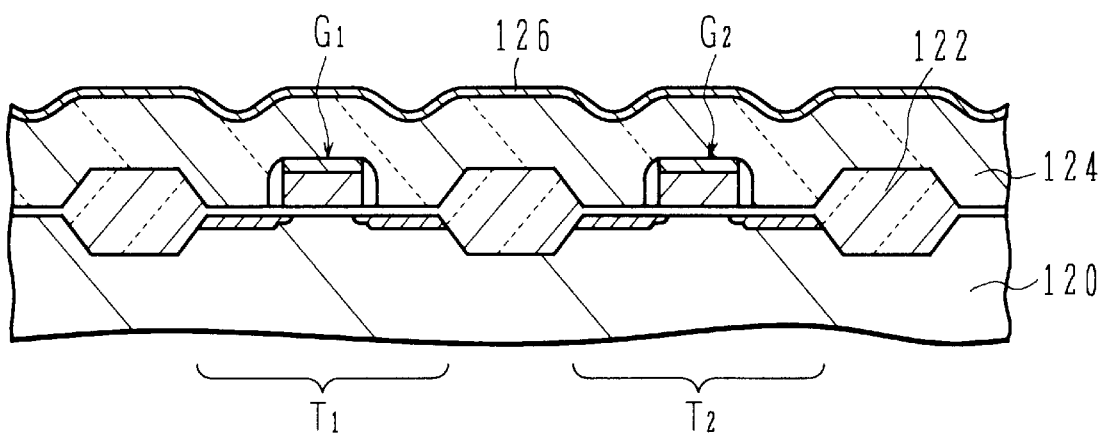
FIG. 20 is a cross sectional view of the substrate illustrating a process of depositing conductive material after the process of FIG. 19.

(20) As shown in FIG. 20, a conductive material layer 126 serving both as an antireflection film and etching mask is formed on the insulating film 124. As the conductive material layer 126, a TiN layer or TiON layer may be used. These layers may be deposited by chemical vapor deposition (CVD) or reactive sputtering. The conductive material layer 126 may be deposited to a minimum thickness ensuring an antireflection effect. For example, the thickness of 30 to 50 nm is sufficient if a TiN layer or TiON layer is used and light of i- or g-line of mercury is used for exposure. The conductive material layer 126 has a function of reducing reflection at the whole area of a resist layer coated on the conductive material layer 126. As described earlier, the conductive material layer 126 may be TiN, TiON, CrN, or a laminate of these materials.

Figure 21:
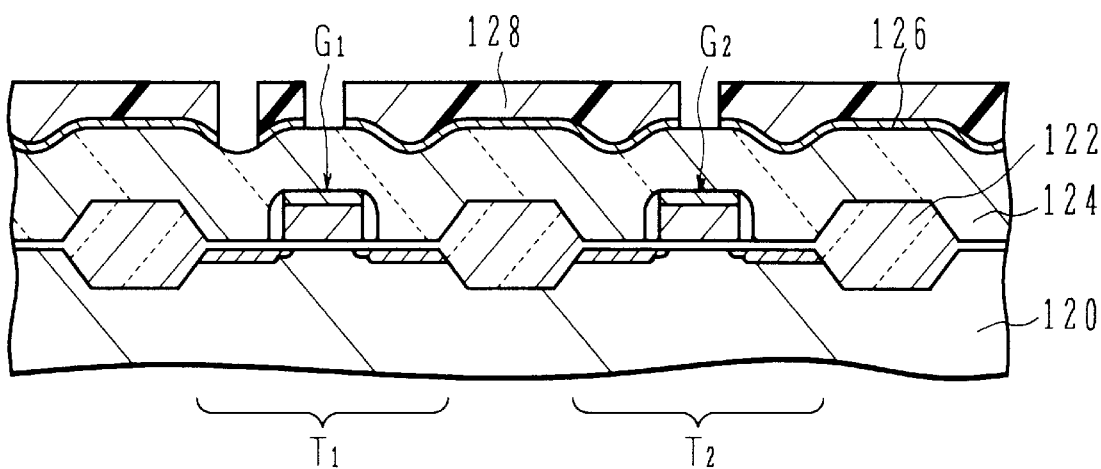
FIG. 21 is a cross sectional view of the substrate illustrating a process of patterning a conductive material layer after the process of FIG. 20.

(21) As shown in FIG. 21, a resist layer 128 having a desired hole pattern is formed over the substrate surface by photolithography, covering the conductive material layer 126. The resist layer 128 is formed to a thickness sufficient for selectively etching the conductive material layer 126. For example, a thickness is set to 0.5 $\mu$m. While the insulating film 124 is selectively etched, the conductive material layer 126 functions as a mask. Since the conductive material layer 126 functions as an antireflection film during a resist exposure process, it is possible to prevent a hole size from becoming large at the region above the gate electrode layer. Furthermore, light scattering at a sloped surface of a step is suppressed so that it is possible to prevent a hole on the sloped surface from becoming elliptical.

Next, by using the resist layer 128 as a mask, holes corresponding to the holes in the resist layer 128 are formed in the conductive material layer 126 by dry etching. As etching gas, it is preferable to use $Cl_2$.

Figure 22:
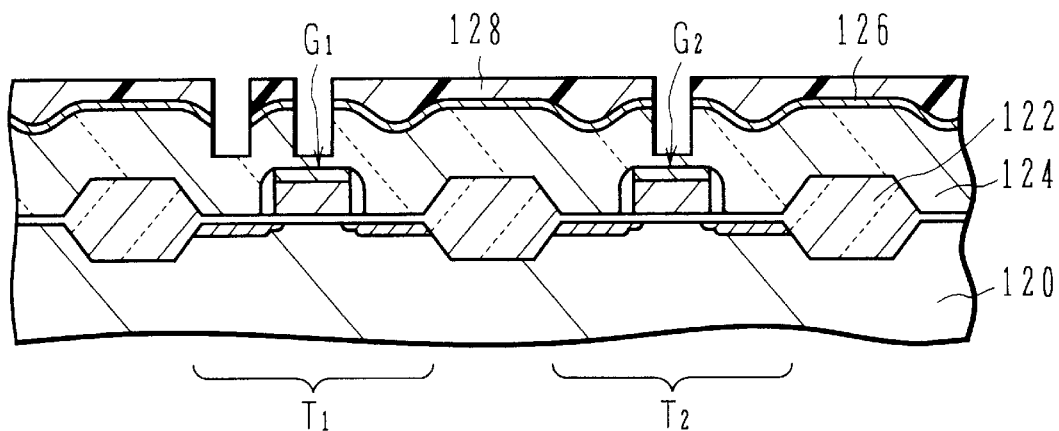
FIG. 22 is a cross sectional view of the substrate illustrating a process of forming contact holes after the process of FIG. 21.

As shown in FIG. 22, by using the resist mask and the conductive material layer 126 as a mask, the insulating film 124 is selectively etched.

Figure 23:
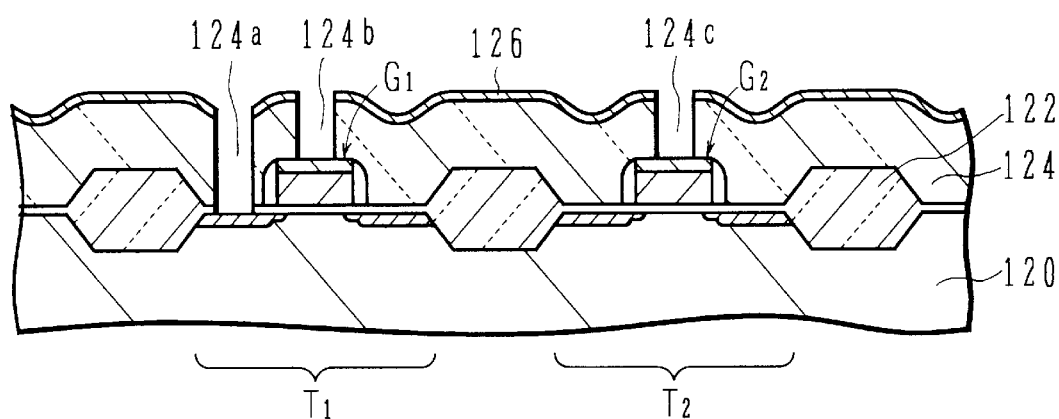
FIG. 23 is a cross sectional view of the substrate illustrating a process of removing resist after the process of FIG. 22.

(23) As shown in FIG. 23, a contact hole 124$a$ reaching the source region SI and contact holes 124$b$ and 124$c$ reaching the gate electrode layers $G_1$ and $B_2$ are formed in the insulating film 124 by dry etching. Since the etching mask is conductive, charge-up on the surface of the mask is not likely to occur. As etching gas, it is preferable to use gas containing fluorine (or freon) and not containing Cl or Br. If gas containing Cl or Br is used, it is difficult to use the conductive layer 126 as an etching mask because Ti chloride or Ti bromide has a higher vapor pressure than Ti oxide or Ti fluoride (Ti and Ti compound is easy to be etched by Cl or Br). In the resist layer 128 remains, it is removed by an ashing process or a washing process using organic solvent.

Usable etching gas includes $CF_4+CHF_3+Ar$, $CHF_3+O_2$, $CHF_3+CO_2$, $C_2F_6+CHF_3$, $CH_2F_2+C4F_6$, and $CHF_3+CO_2+Ar$. If etching gas containing $O_2$ or F is used, titanium oxide ($TiO$, $TiO_2$, $Ti_2O_3$) or titanium fluoride ($TiF_3$) of a low vapor pressure is formed on the surface of a TiN layer (or TiON layer), and TiN (or TiON) etching is suppressed. As a result, the TiN (or TiON) layer accomplishes a reliable function of an etching mask.

Figure 24:
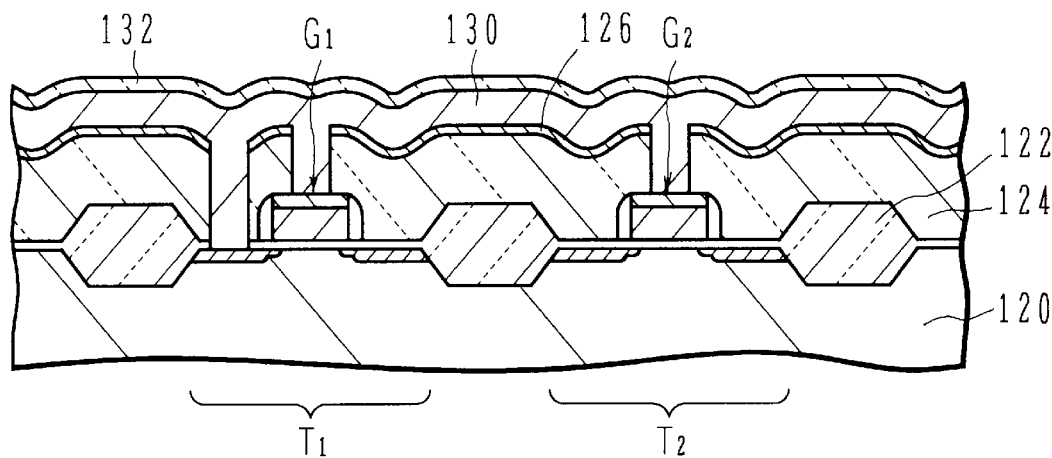
FIG. 24 is a cross sectional view of the substrate illustrating a process of depositing wiring material and conductive material after the process of FIG. 23.

(24) As shown in FIG. 24, a wiring layer 130 made of a lamination of a barrier metal layer (such as Ti, TiN, etc.) and a layer made of Al or Al alloy is deposited over the substrate surface by sputtering, covering the insulating film 124 and filling contact holes 124$a$ to 124$c$. A conductive material layer 132 of TiN or TiON serving as antireflection coating is formed on the wiring material layer 132, by reactive sputtering. The material of the conductive material layer 132 may be a material selected from a group consisting of TiN, TiON, CrN, and a laminate thereof.

Figure 25:
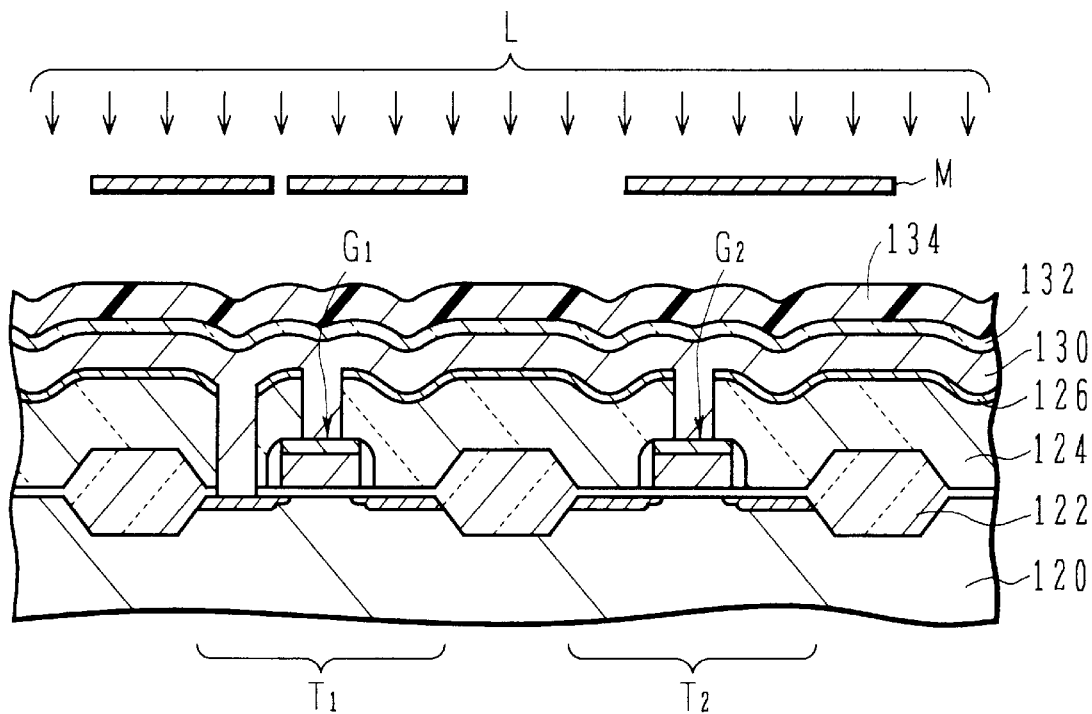
FIG. 25 is a cross sectional view of the substrate illustrating a process of forming a resist layer and an exposure process after the process of FIG. 24.
Figure 26:
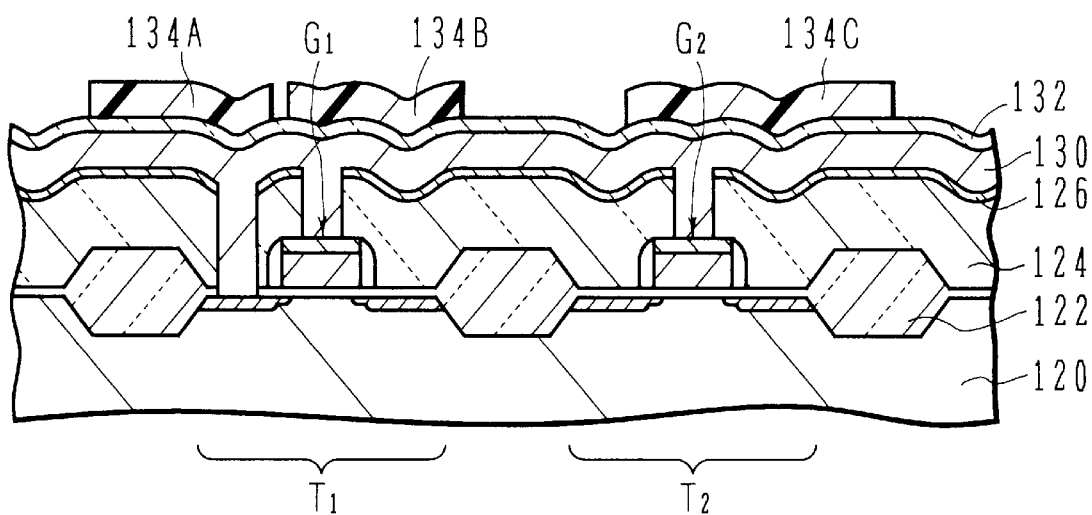
FIG. 26 is a cross sectional view of the substrate illustrating a resist developing process after the process of FIG. 25.

(25) As shown in FIGS. 25 and 26, a resist pattern for patterning a wiring material layer is formed by photolithography. First, as shown in FIG. 25, a resist layer 134 is formed over the substrate surface by spin coating, covering the conductive material layer 132. The resist layer 134 is subjected to an exposure process. At this exposure process, exposure light L is applied to the resist layer 134 through a light shielding mask M having a desired wiring pattern.

(26) Then, as shown in FIG. 26, the resist layer 134 is subjected to a development process to leave resist layers 134A, 134B, and 134C corresponding to the desired wiring pattern.

Figure 27:
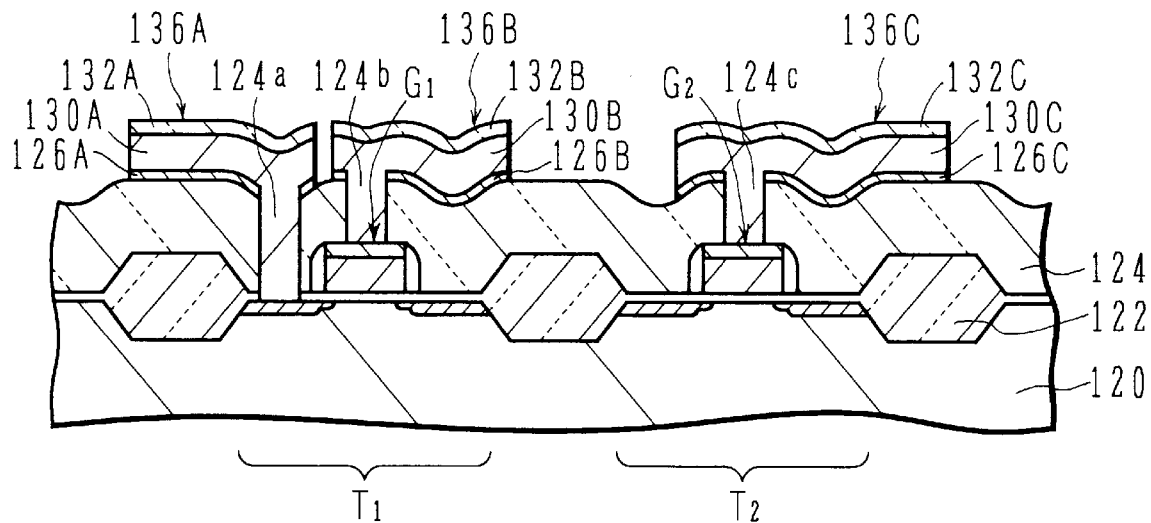
FIG. 27 is a cross sectional view of the substrate illustrating a wiring patterning process after the process of FIG. 26.

(27) As shown in FIG. 27, by using the resist layers 134A to 134C as a mask, the conductive layer 132 is patterned by dry etching. In this manner, a mask of the conductive material layer 132 similar to that shown in FIG. 21 is formed. By using this pattern of the resist as a mask, the underlie wiring material layer 130 and conductive material layer 126 are patterned. In this manner, conductive material layers 126A to 126C, wiring material layers 130A to 130C, and conductive material layers 132A to 132C are left.

The conductive material layer 126A, wiring material layer 130A, and conductive material layer 132A constitute a wiring layer 136A connected through the contact hole 124$a$ to the source region Si. The conductive material layer 126B, wiring material layer 130B, and conductive material layer 132B constitute a wiring layer 136B connected through the contact hole 124$b$ to the gate electrode layer $G_1$. The conductive material layer 126C, wiring material layer 130C, and conductive material layer 132C constitute a wiring layer 136C connected through the contact hole 124$c$ to the gate electrode layer $G_2$.

Figure 28:
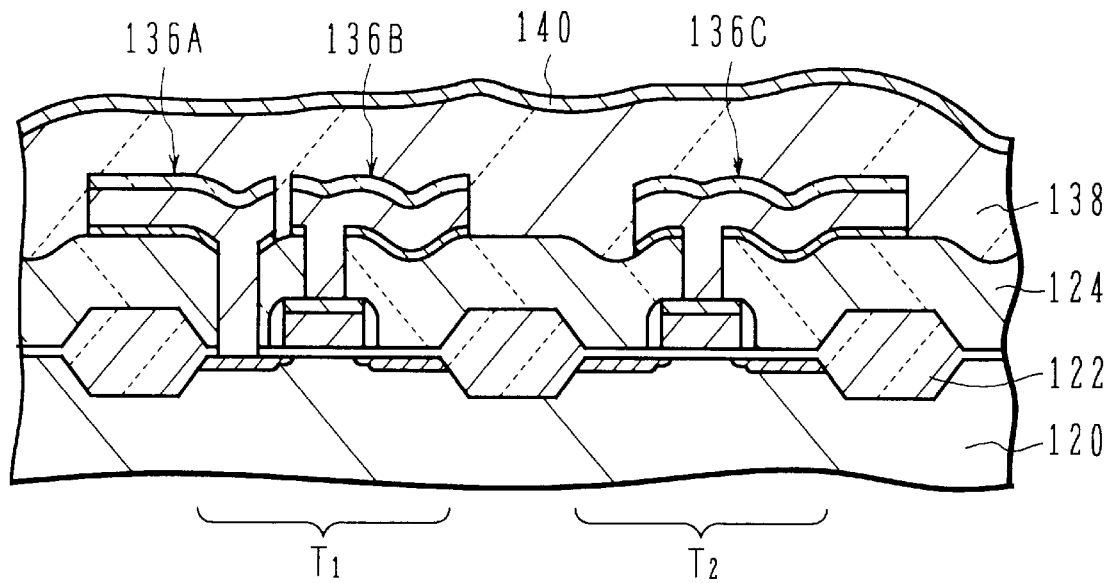
FIG. 28 is a cross sectional view of the substrate illustrating a process of forming an interlevel insulating film and a process of depositing conductive material after the process of FIG. 27.

(28) As shown in FIG. 28, an interlevel insulating film 138 is formed over the substrate surface by CVD, covering the insulating film 124 and wiring layers 136A to 136C. A conductive material layer 140 of TiN or TiON serving both as antireflection layer and etching mask is formed on the insulating film 138. The material of the conductive material layer 140 may be a material selected from a group consisting of Ti, TiN, TiON, TiW, and a laminate thereof.

Figure 29:
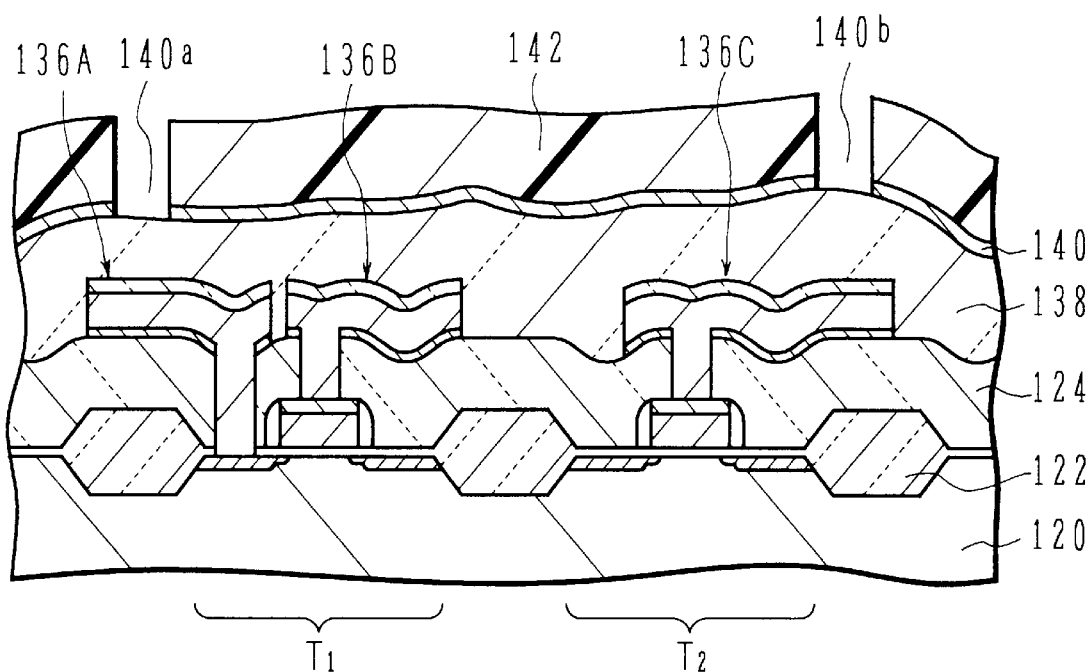
FIG. 29 is a cross sectional view of the substrate illustrating a process of forming a resist film and a process of etching the conductive material after the process of FIG. 28.

(29) As shown in FIG. 29, a resist layer 142 having a desired hole pattern is formed on the conductive material layer 140 by photolithography. Since the conductive material layer 140 exists under the resist layer 142, reflected light is reduced. Similar to the resist layer 128 shown in FIG. 21, the resist layer 142 can be made thin so that a high patterning precision is obtained. By using the resist layer 142 as a mask, holes 140$a$ and 140$b$ corresponding to the holes in the resist layer 142 are formed in the conductive material layer 140 by dry etching.

Figure 30:
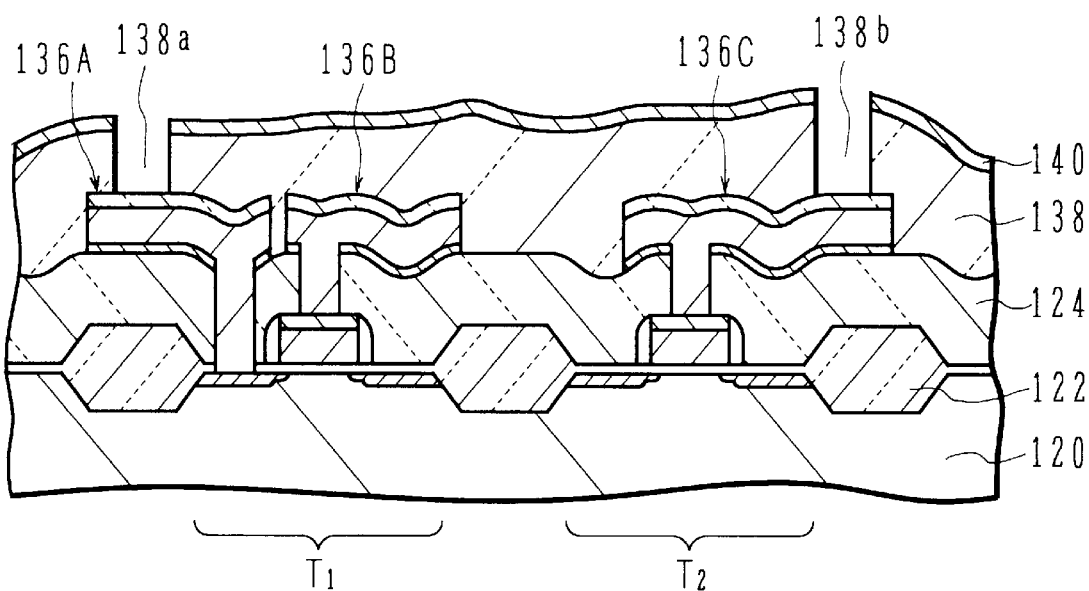
FIG. 30 is a cross sectional view of the substrate illustrating a process of forming contact holes after the process of FIG. 29.

(30) As shown in FIG. 30, by using the resist mask and conductive material layer 140 as a mask, contact holes 138$a$ and 138$b$ corresponding to the holes 140$a$ and 140$b$ of the conductive layer 140 are formed in the insulating film 38 by dry etching. Since the mask of the conductive layer 140 is conductive, charge-up on the mask surface is reduced. The contact holes 138$a$ and 138$b$ are formed to reach the wiring layers 136A and 136C, respectively.

Figure 31:
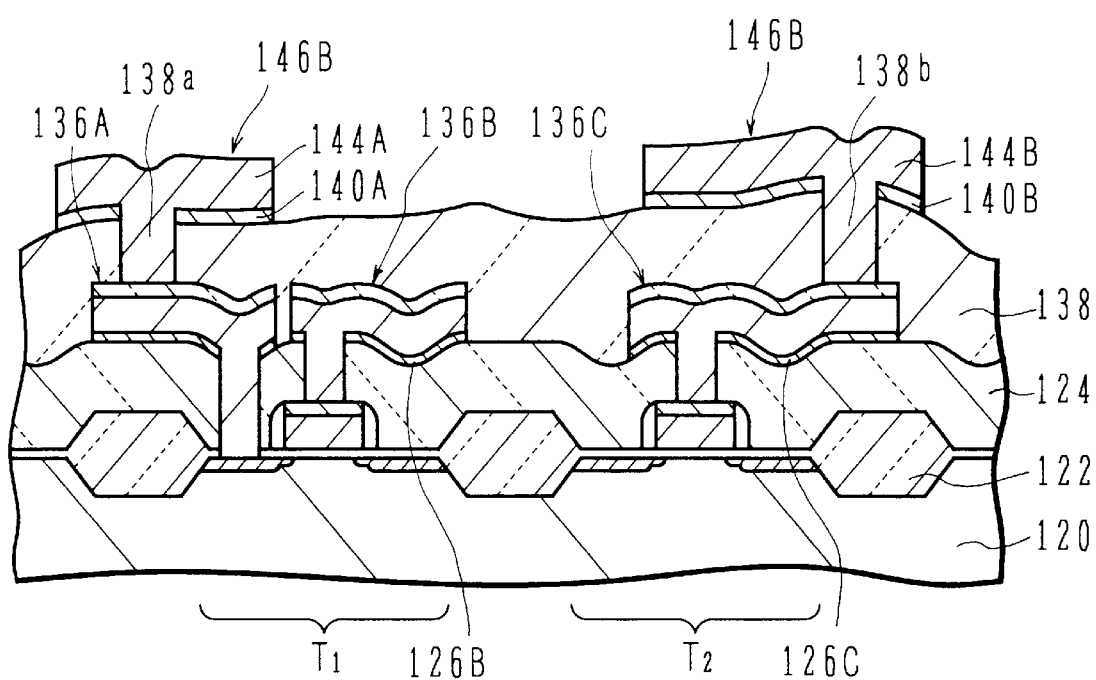
FIG. 31 is a cross sectional view of the substrate illustrating a process of forming a wiring pattern after the process of FIG. 30.
Figure 32:
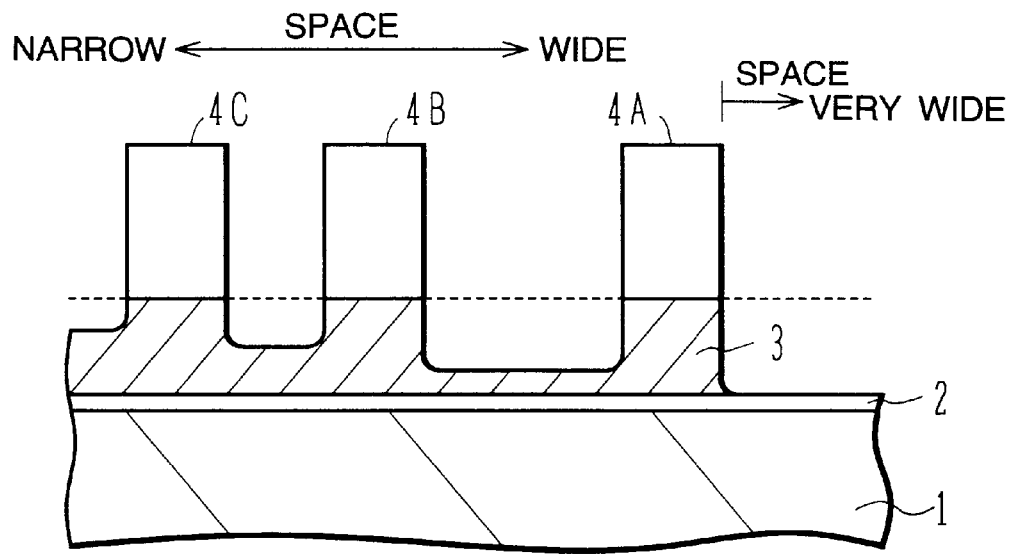
FIG. 32 is a cross sectional view of a substrate illustrating how an etching rate lowers at a narrow space.
Figure 33:
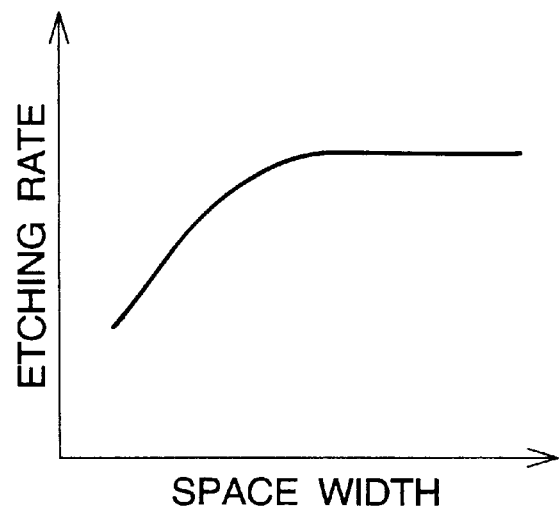
FIG. 33 is a graph showing the relationship between a space width and an etching rate.
Figure 34:
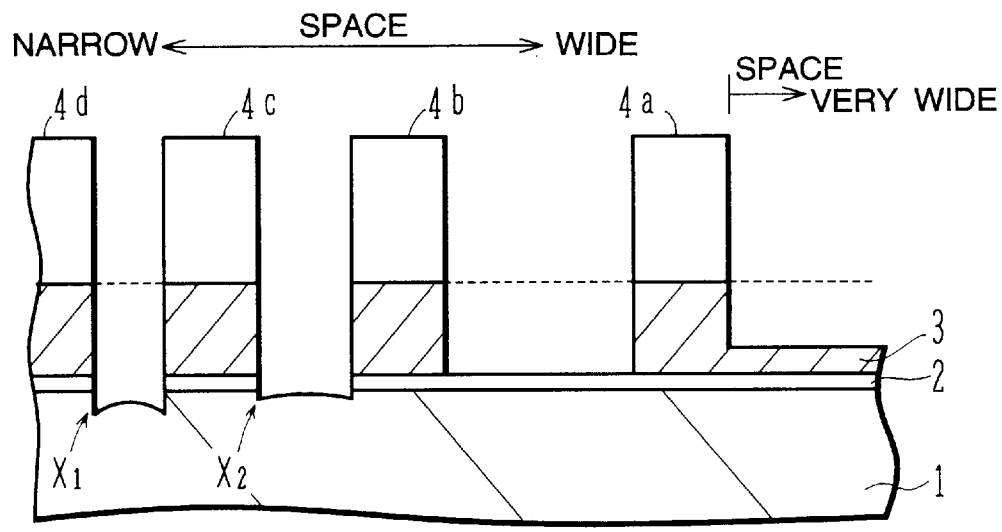
FIG. 34 is a cross sectional view of a substrate illustrating how an etching rate increases at a narrow space.
Figure 35:
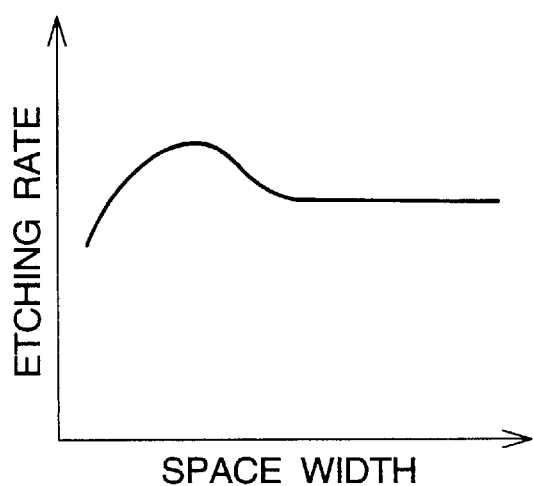
FIG. 35 is a graph showing the relationship between a space width and an etching rate.
Figure 36:
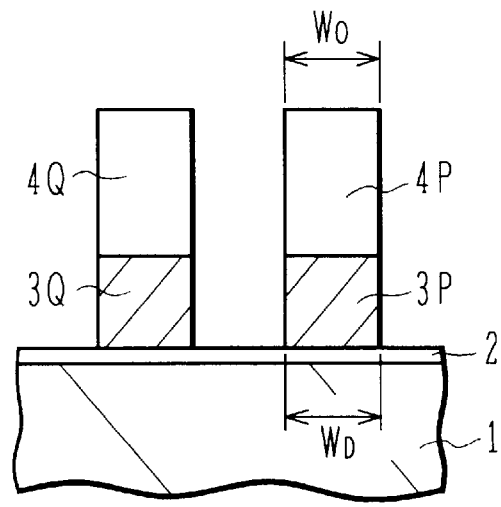
FIG. 36 is a cross sectional view of a substrate illustrating how densely distributed wiring patterns are etched.
Figure 37:
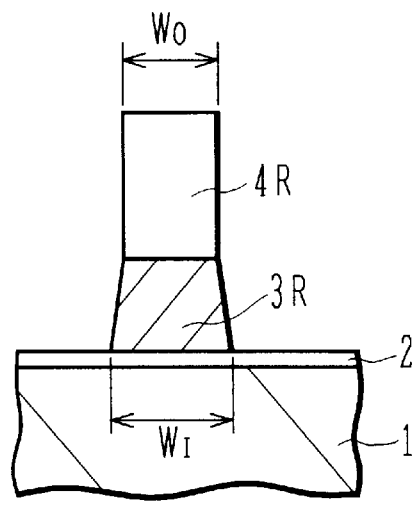
FIG. 37 is a cross sectional view of a substrate illustrating how an isolated wiring pattern is etched.
Figure 38:
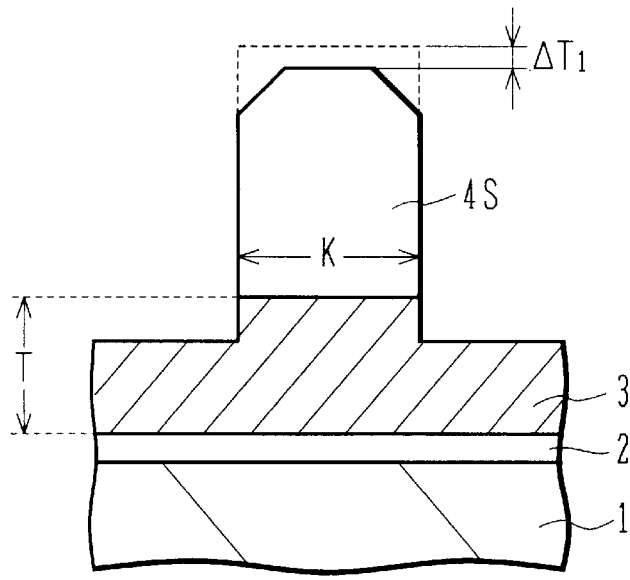
FIG. 38 is a cross sectional view illustrating how mask material for fine wiring pattern etching is etched.
Figure 39:
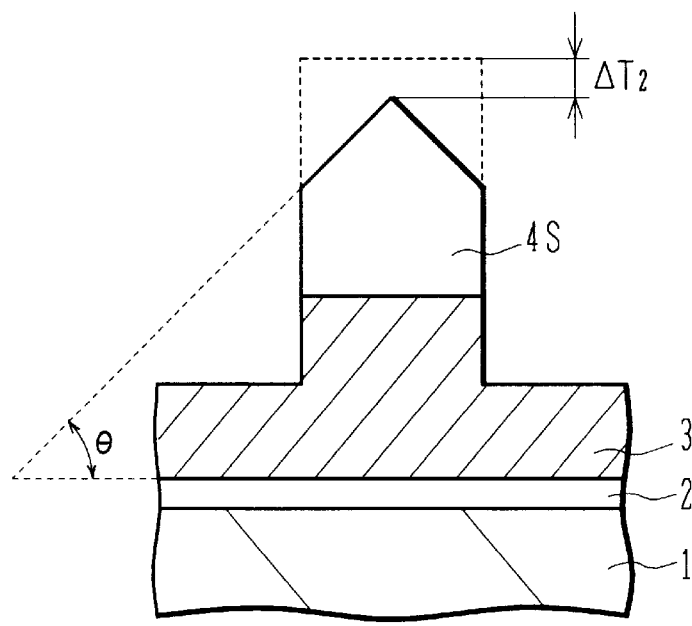
FIG. 39 is a cross sectional view showing the etching state progressed further from the etching state shown in FIG. 38.
Figure 40:
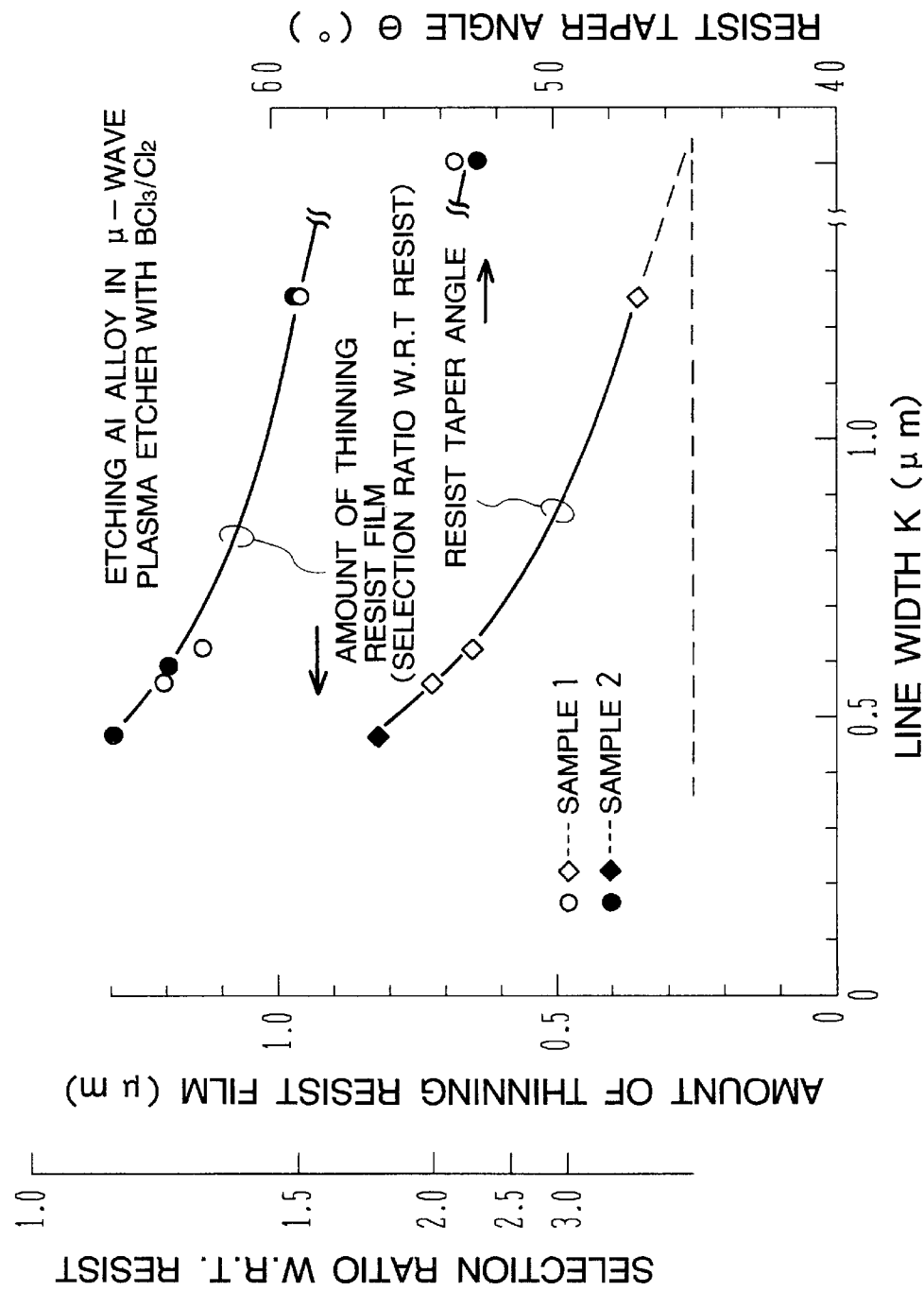
FIG. 40 is a graph showing a dependence upon a line width of an amount of thinning a resist film, a selective etching ratio of the resist film, and a resist film taper angle.
Figure 41:
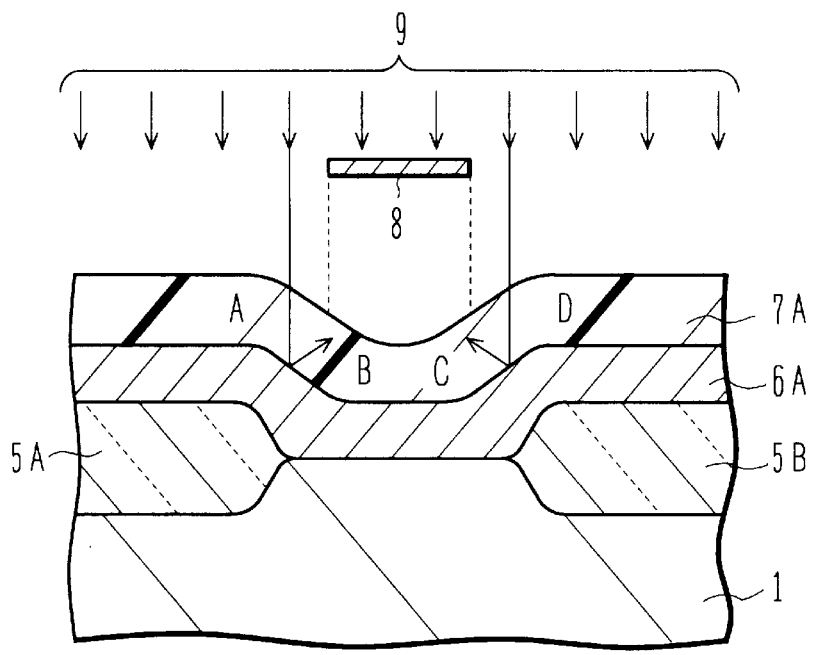
FIG. 41 is a cross sectional view of a substrate showing a resist exposing state, wherein the substrate has a step.
Figure 42:
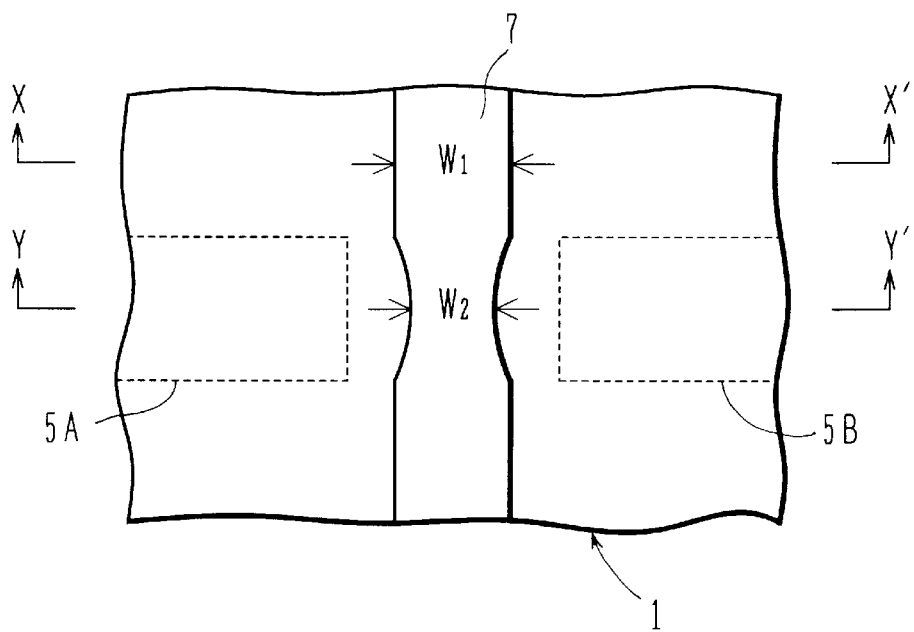
FIG. 42 is a plan view of the substrate illustrating the resist development step.
Figure 43:
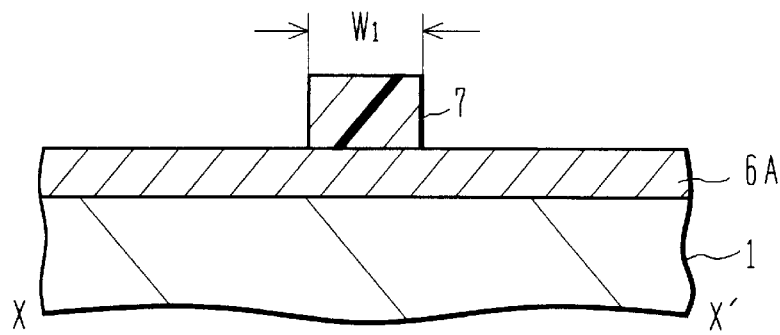
FIG. 43 is a cross sectional view taken along line X—X' shown in FIG. 42.
Figure 44:
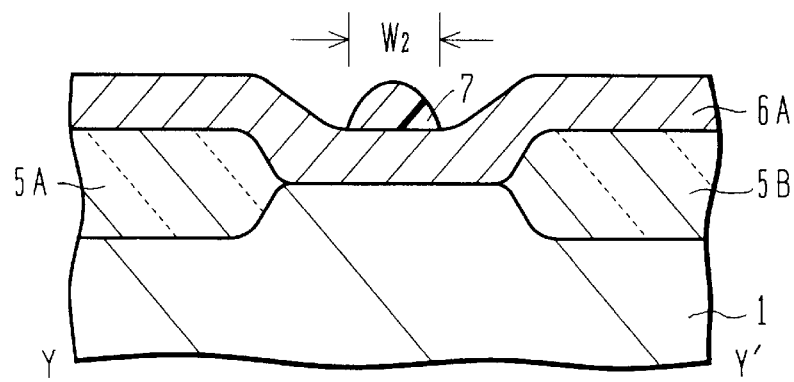
FIG. 44 is a cross sectional view taken along line Y—Y' shown in FIG. 42.
Figure 45:
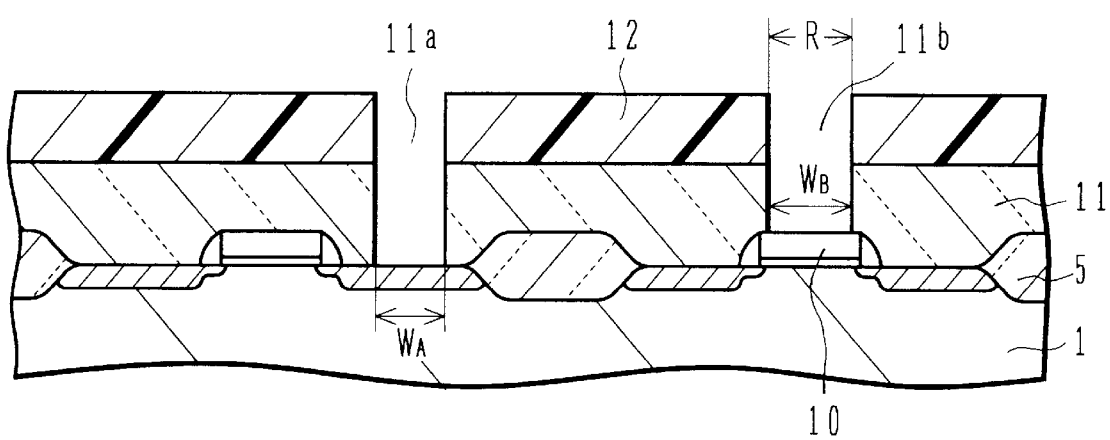
FIG. 45 is a cross sectional view of a substrate illustrating how contact holes are formed on a substrate having different contact areas of reflectivities.
Figure 46:
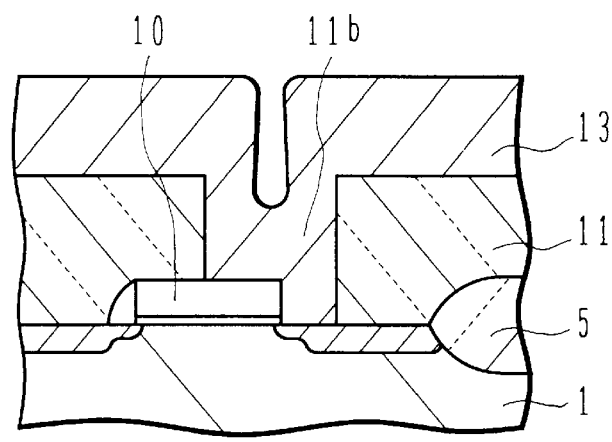
FIG. 46 is a cross sectional view of a substrate illustrating a wiring pattern formed on an off-set contact hole.
Figure 47:
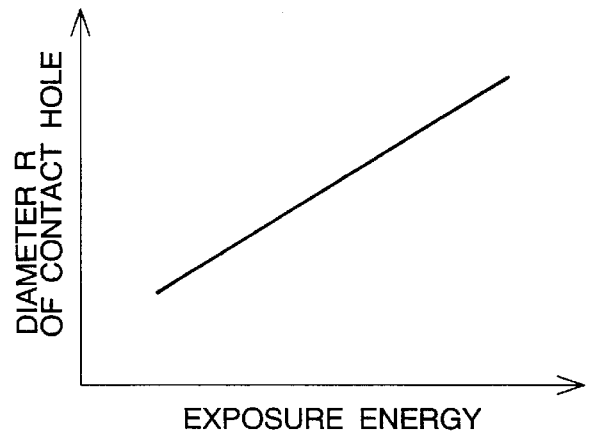
FIG. 47 is a graph showing the relationship between an exposure energy and a contact hole diameter.
Figure 48:
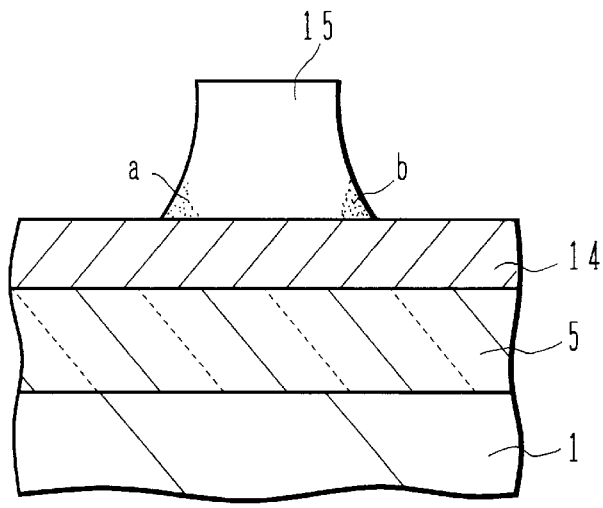
FIG. 48 is a cross sectional view of a substrate illustrating a process of forming a resist mask containing dye.

(31) As shown in FIG. 31, wiring material of Al alloy, such as Al-Si-Cu and Al-Si, is sputtered on the conductive material layer 140 to form a wiring material layer. A laminate of this wiring material layer and conductive material layer 140 is patterned to leave conductive material layers 140A and 140B and wiring material layers 144A and 144B having desired wiring patterns, similar to the etching of the lower level wiring. The conductive material layer 140A and wiring material layer 144A constitute a wiring layer 146A connected to the wiring layer 136A through the contact hole 138$a$. The conductive material layer 140B and wiring material layer 144B constitute a wiring layer 146B connected to the wiring layer 136C through the contact hole 138$b$.

In the above embodiment, the conductive material layers 126A to 126C and conductive material layers 140A and 140B are left to use them as parts of the wiring layers. The conductive material layers 126 may be removed after the contact holes are formed at the process shown in FIG. 23 or 30. This removal process may use a piranha cleaning process by $H_2SO_4+H_2O_2$.

In the above embodiment, the insulating film 124 or 138 is selectively etched at the process shown in FIG. 23 or 30. Without removing the resist layer 128 or 142, the insulating film 124 or 138 may be selectively etched by using as a mask a laminate of the resist layer 128 and conductive material layer 126 and a laminate of the resist layer 142 and conductive material layer 140. The resist layer 128 or 142 is being removed while the insulating film 124 or 136 is etched. It is not necessary therefore to use a separate process of removing the resist layer 128 or 142.

In order to confirm that a TiN layer is effective for an etching mask, experiments were made in which TiN, plasma $SiO_2$ ($SiO_2$ deposited by plasma CVD), and BPSG were etched by using the magnetron RIE system shown in FIG. 18.

TiN, plasma $SiO_2$, and BPSG were etched by using the magnetron RIE system shown in FIG. 18, and data shown in Table 4 was obtained. The etching conditions were as follows. A flow of $CF_4/CHF_3/Ar$ was 5/30/100 sccm, a gas pressure was 200 mTorr, an RF power (13.56 MHz) was 700 W, and a magnetic flux density was 40 Gauss.

TABLE 4

| Etching rate [nm/min.] | | Etching ratio | |
|---|---|---|---|
| Plasma $SiO_2$ | 284.2 | Plasma $SiO_2$/TiN | 17.0 |
| BPSG | 457.2–477.1 | BPSG/TiN | 27.4–28.6 |
| TiN | 16.7 | | |

From Table 4, it can be understood that in etching a plasma $SiO_2$ film having a thickness of 1000 nm by using a TiN layer as a mask, a necessary thickness of the TiN layer is 76.5 nm at an over-etch of 30%, and that in etching a BPSG film having a thickness of 1000 nm by using a TiN layer as a mask, a necessary thickness of the TiN layer is 47.4 nm at an over-etch of 30%.

This embodiment is not limited to forming contact holes in an insulating film, but is applicable to forming a recess such as a wiring groove in an insulating film.

The present invention has been described in connection with the preferred embodiments. The invention is not limited only to the above embodiments. It is apparent to those skilled in the art that various modifications, substitutions, combinations and the like can be made without departing from the scope of the appended claims.

I claim:

1. A method of manufacturing a semiconductor device, comprising the steps of:
   a) providing a substrate;
   b) forming a conductive layer over of the substrate;
   c) forming a conductive antireflection layer having a metal component on the conductive layer;
   d) providing a resist mask for patterning the conductive antireflection layer;
   e) selectively removing the conductive antireflection layer by a first etching gas to form a laminated mask of the resist mask and a conductive antireflection mask self-aligned with the resist mask, the first gas comprising a material selected from the group consisting of $Cl_2$, HCl, $SiCl_4$, $Cl_2+BCl_3$, and $CCl_4$, and combinations thereof; and
   f) selectively removing the conductive layer through the laminated mask by a second etching gas which is different from the first etching gas, the second etching gas reacting with the metal component of the antireflection film to form a compound which suppresses etching of the antireflection film.

2. A method according to claim 1, wherein the conductive layer comprises a material selected from a group consisting of polycrystalline silicon and a laminated layer of a polycrystalline silicon layer and a refractory metal silicide layer.

3. A method according to claim 1, wherein the second gas comprises a material selected from group consisting of $Cl_2+O_2$ and $HBr+O_2$.

4. A method according to claim 1, wherein the conductive layer and the conductive anti-reflection layer collectively serve as a conductive wiring.

5. A method of manufacturing a semiconductor device, comprising the steps of:
   a) providing a substrate;
   b) forming a conductive layer over the substrate;
   c) forming a conductive antireflection layer having a metal component on the conductive layer;
   d) providing a resist mask for patterning the conductive antireflection layer, the conductive antireflection layer comprising a material selected from a group consisting of TiN, TiON, and CrN;
   e) selectively removing the conductive antireflection layer by a first etching gas to form a laminated mask of the resist mask and a conductive antireflection mask self-aligned with the resist mask, the first gas comprising a material selected from the group consisting of $Cl_2$, HCl, $SiC_4$, $Cl_2+BCl_3$, and $CCl_4$, and combinations thereof; and
   f) selectively removing the conductive layer through the laminated mask by a second etching gas which is different from the first etching gas, the second etching gas reacting with the metal component of the antireflection film to form a compound which suppresses etching of the antireflection film.

6. A method of manufacturing a semiconductor device, comprising the steps of:
   a) providing a substrate;
   b) forming a conductive layer over the substrate;
   c) forming a conductive antireflection layer having a metal component on the conductive layer;
   d) providing a resist mask for patterning the conductive antireflection layer;
   e) selectively removing the conductive antireflection layer by a first etching gas to form a laminated mask of the resist mask and a conductive antireflection mask self-aligned with the resist mask, the first gas comprising a material selected from the group consisting of $Cl_2$, HCl, $SiCl_4$, $Cl_2+BCl_3$ and $CCl_4$, and combinations thereof; and
   f) selectively removing the conductive layer through the laminated mask by a second etching gas which is different from the first etching gas, the second etching gas reacting with the metal component of the antireflection film to form a compound which suppresses etching of the antireflection film, the conductive anti-reflection film (is) being left after the step f) to serve as a layer for preventing electromigration in the conductive layer.

* * * * *